United States Patent [19]
Ueno

[11] Patent Number: 5,132,755
[45] Date of Patent: Jul. 21, 1992

[54] FIELD EFFECT TRANSISTOR

[75] Inventor: Masuhide Ueno, Tokyo, Japan

[73] Assignee: Oki Electric Industry Co. Ltd., Japan

[21] Appl. No.: 739,382

[22] Filed: Aug. 1, 1991

Related U.S. Application Data

[63] Continuation of Ser. No. 550,687, Jul. 10, 1990, abandoned.

[30] Foreign Application Priority Data

Jul. 11, 1989 [JP] Japan .................. 1-177174
Jul. 4, 1990 [JP] Japan .................. 2-176999

[51] Int. Cl.$^5$ .............. H01L 27/01; H01L 27/12; H01L 29/06; H01L 29/04
[52] U.S. Cl. .................. 357/23.1; 357/49; 357/56; 357/59
[58] Field of Search .............. 357/23.1, 59, 56, 49

[56] References Cited

U.S. PATENT DOCUMENTS 4,862,232 8/1989 Lee .................. 357/23.1
4,887,145 12/1989 Washio et al. .................. 357/59

FOREIGN PATENT DOCUMENTS 53-62985 6/1978 Japan .
61-61464 3/1986 Japan .

*Primary Examiner*—Mark V. Prenty
*Attorney, Agent, or Firm*—Edward D. Manzo

[57] ABSTRACT

A field effect transistor is disclosed in which an underlayer has the protrusion wherein the channel is to be formed, and a lower insulating layer is provided on the underlayer around the protrusion. On the upper side of the lower insulating layer, first and second principal electrode region are respectively positioned on the two sides of the protrusion in the length-wise direction of the channel. Parts of the principal electrode regions make a junction with protrusion along the width-wise direction of the channel. On the upper side of the protrusion a gate electrode is provided with a gate insulating therebetween. The principal electrode regions serve as source/drain regions.

11 Claims, 26 Drawing Sheets

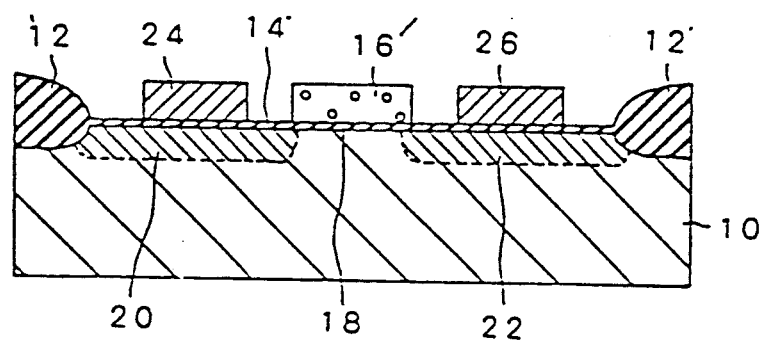
FIG_1

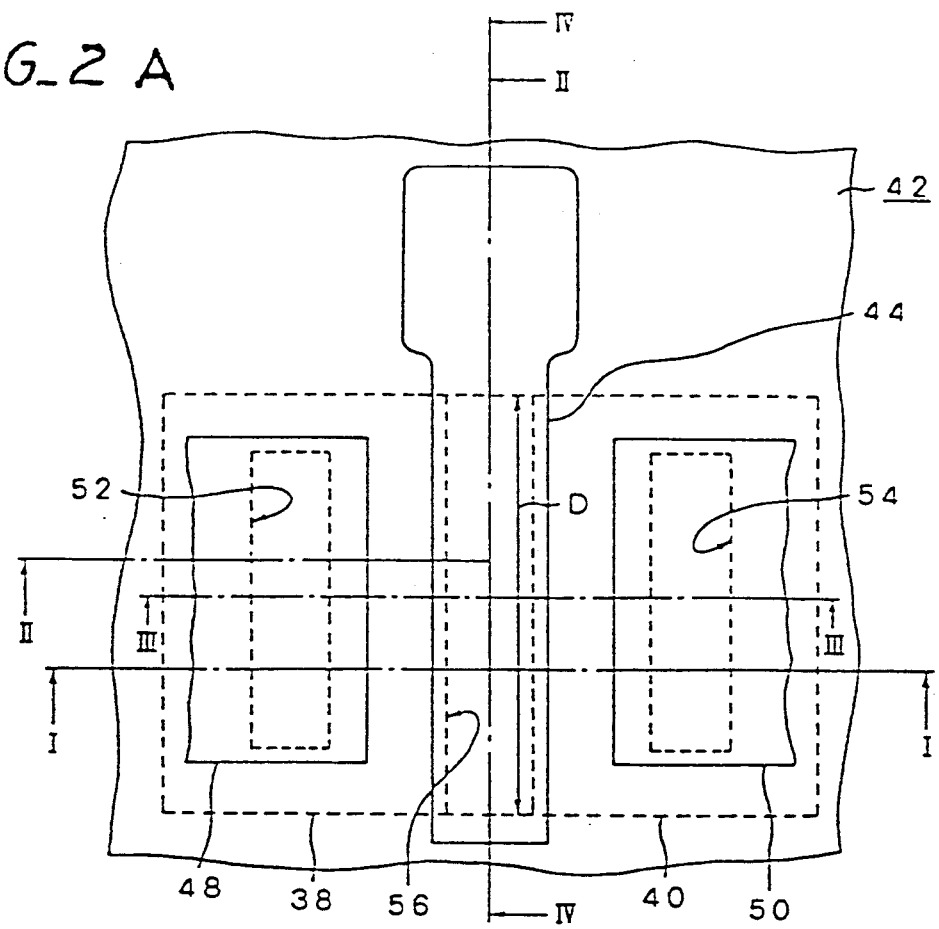
FIG_2 A
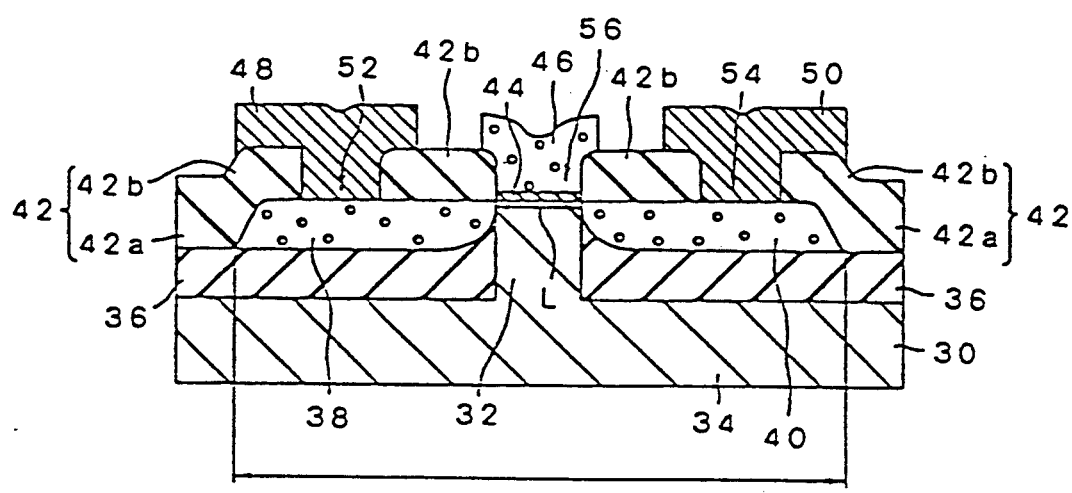
FIG_2 B

FIG_2C
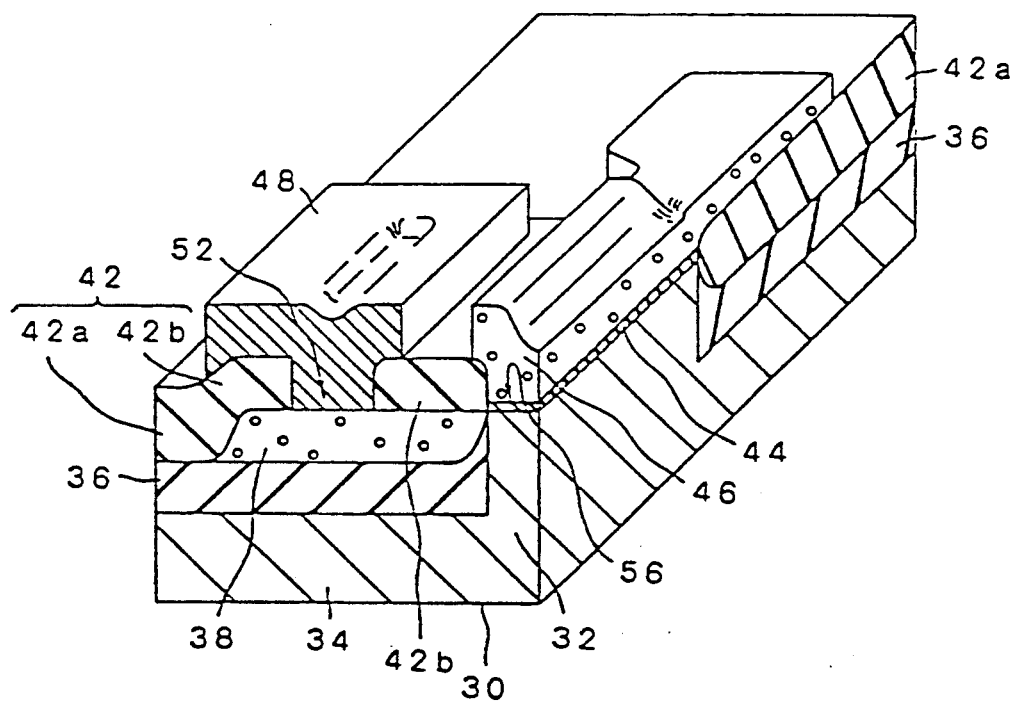

FIG_3
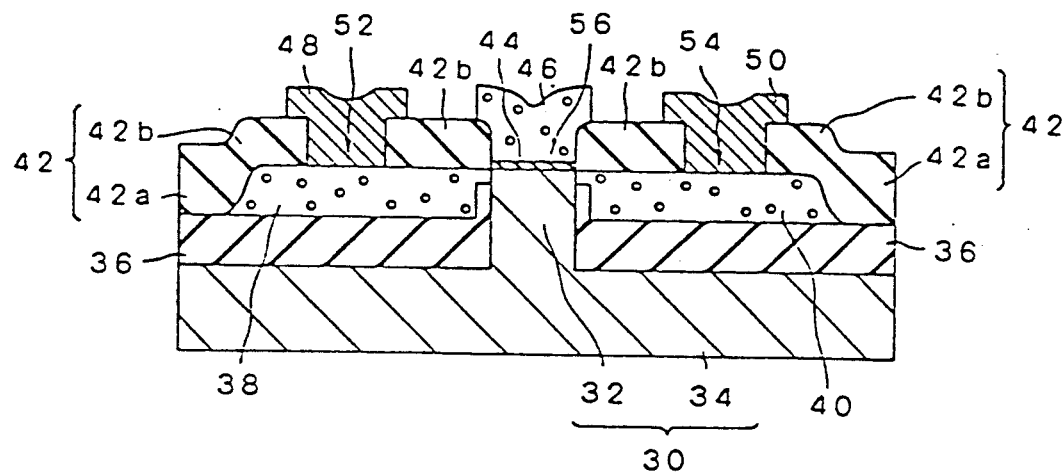
FIG_4
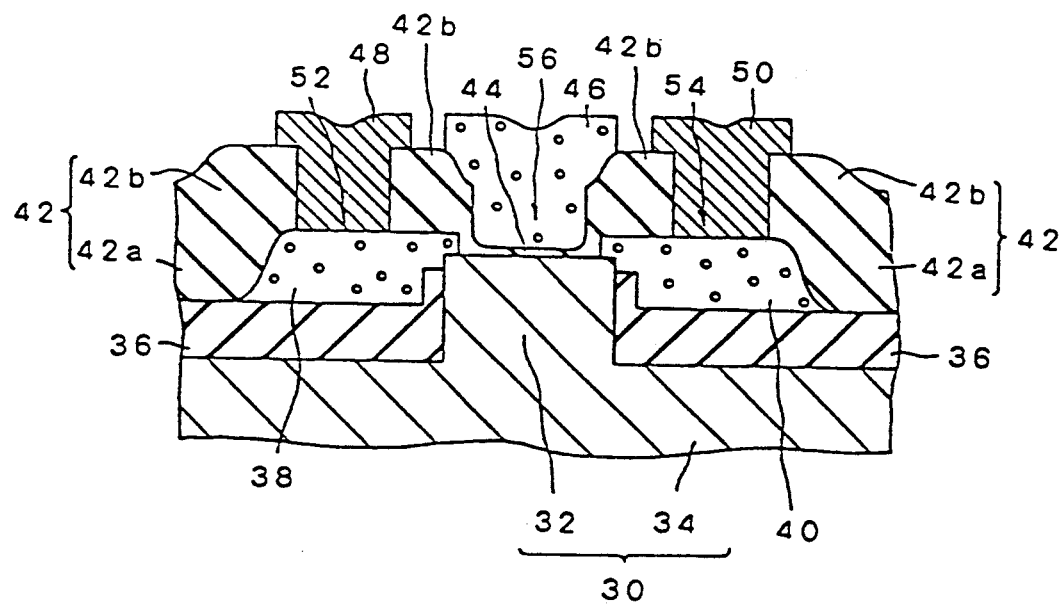

FIG_5
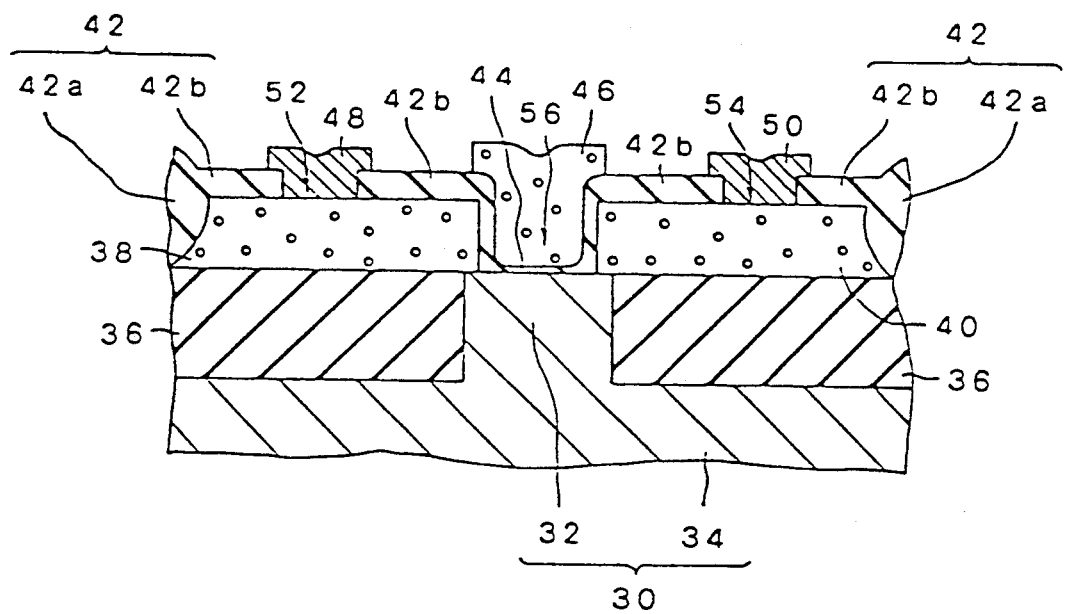
FIG_6
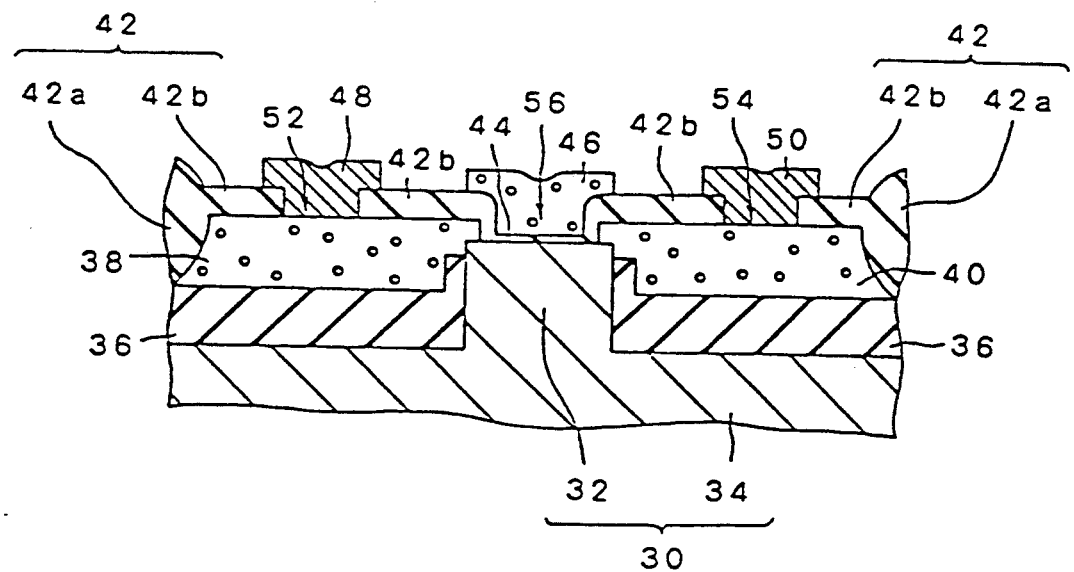

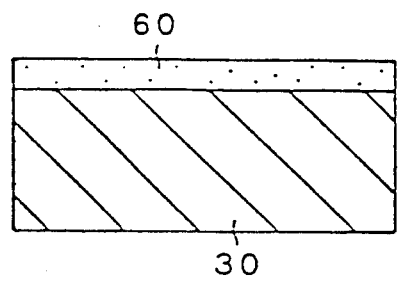
FIG_7 A
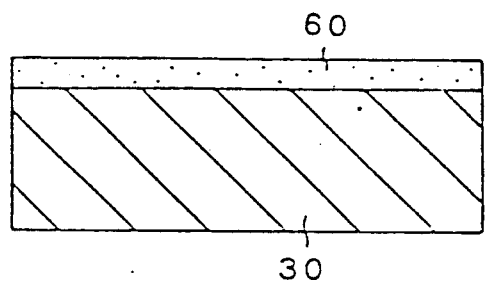
FIG_8 A
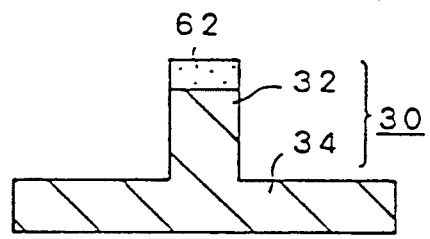
FIG_7 B
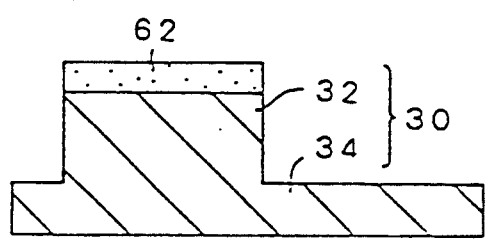
FIG_8 B
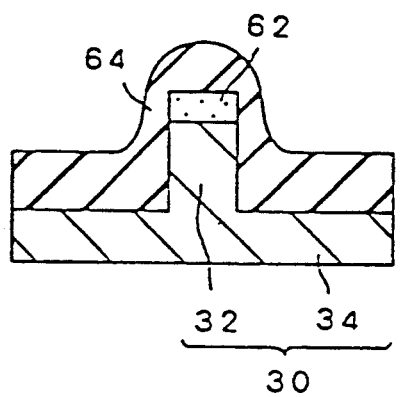
FIG_7 C
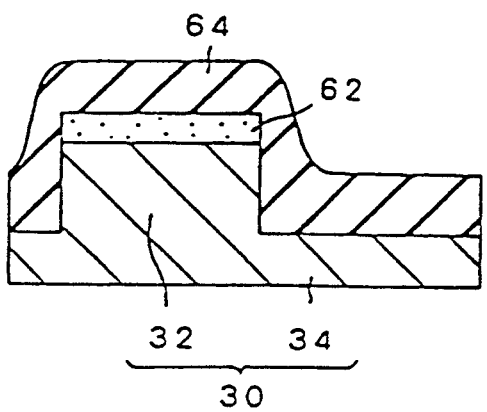
FIG_8 C FIG_7 D
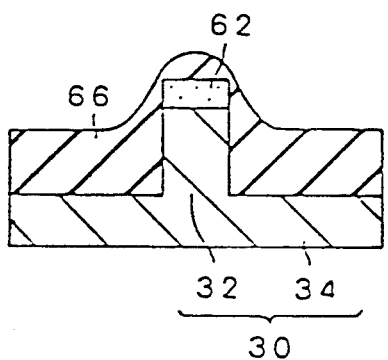
FIG_8 D
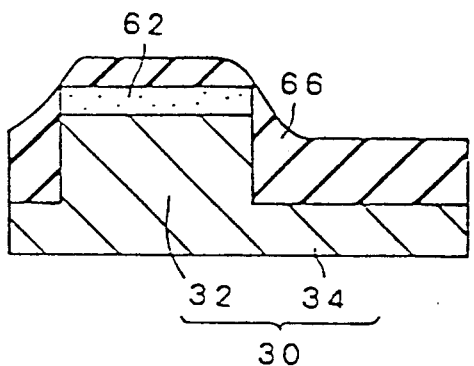
FIG_7 E
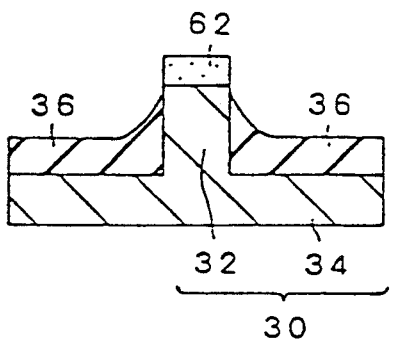
FIG_8 E
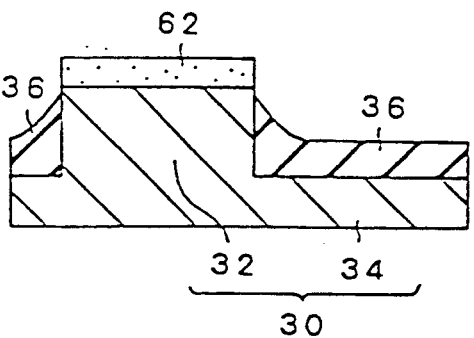
FIG_7 F
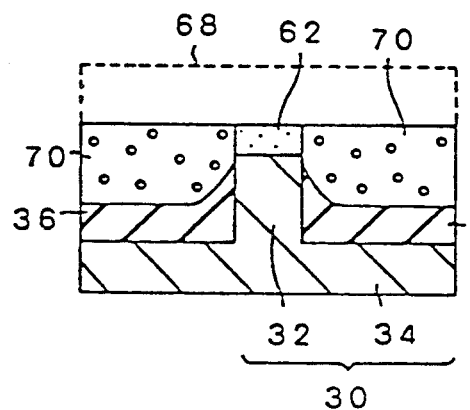
FIG_8 F
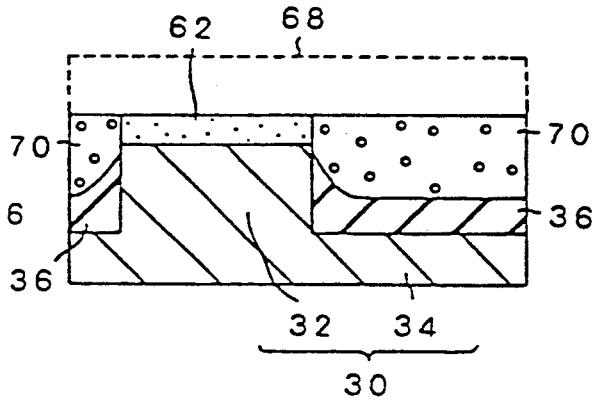

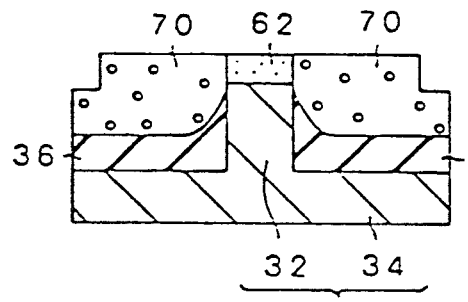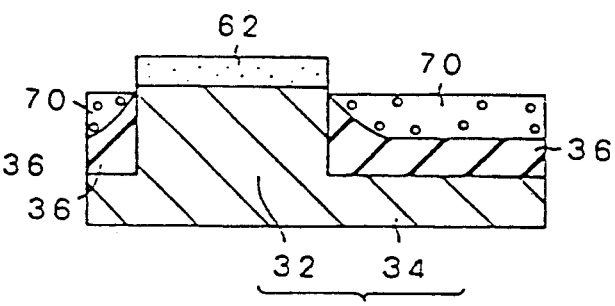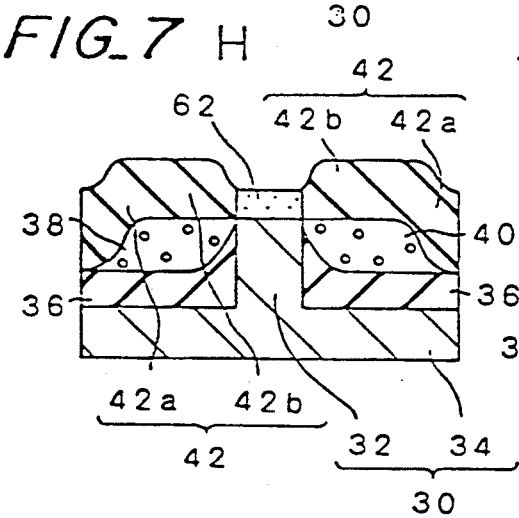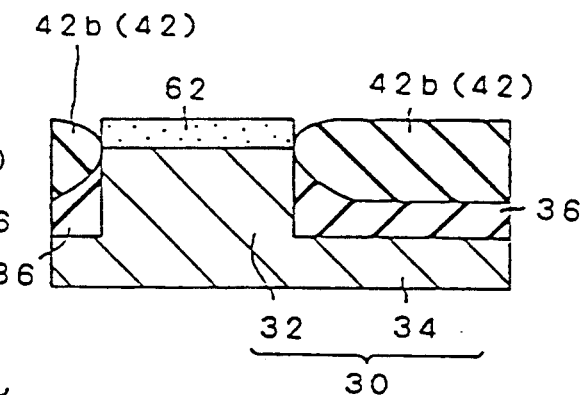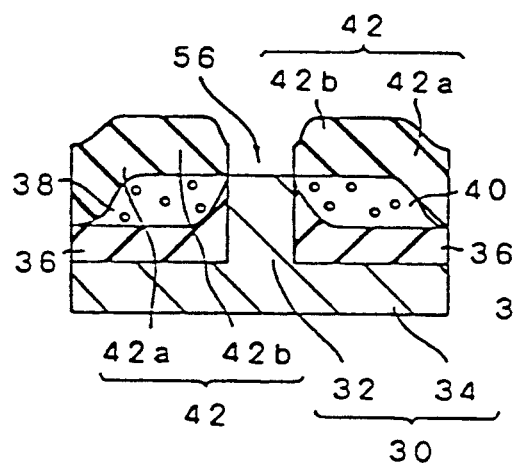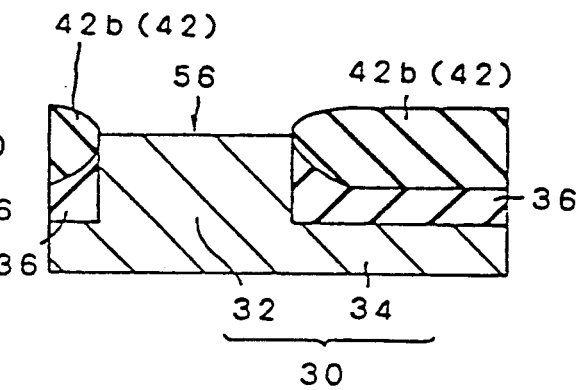

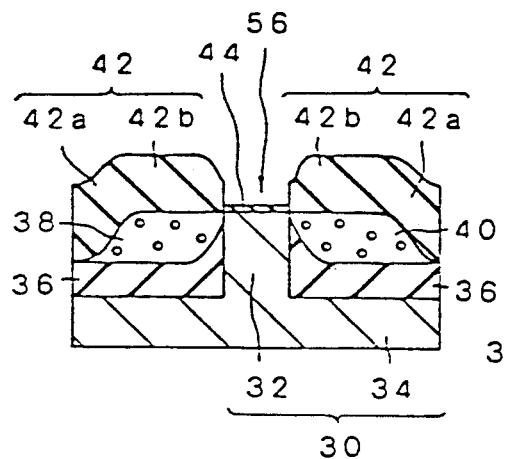
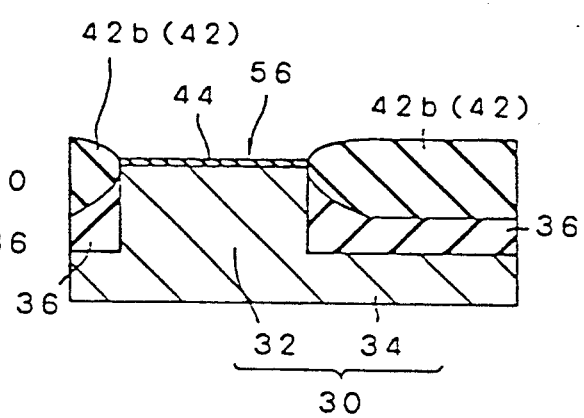
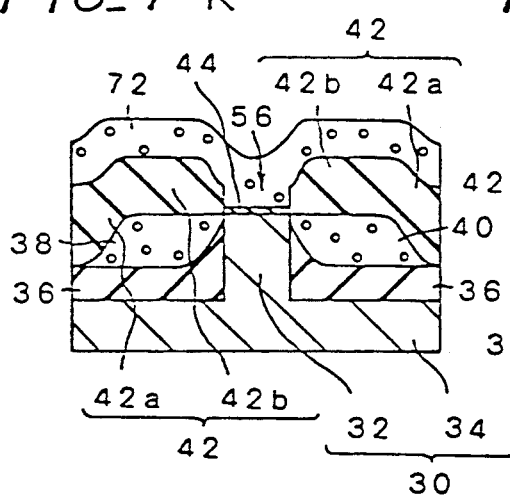
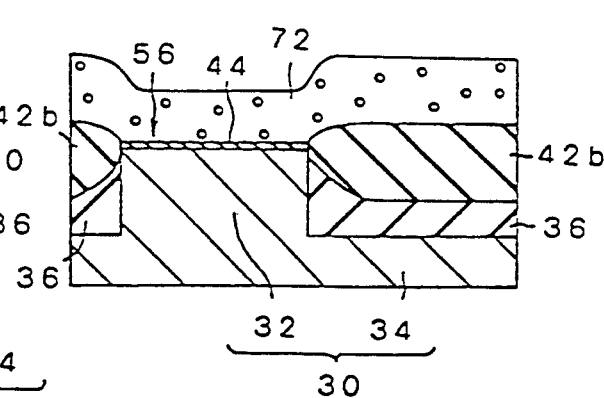
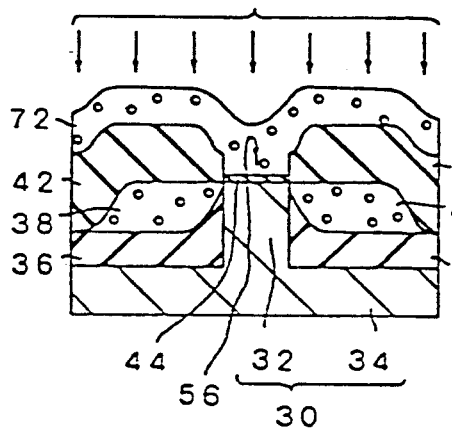
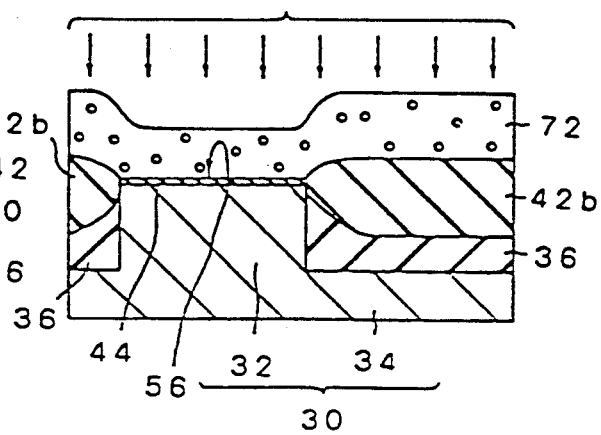

FIG_7 M
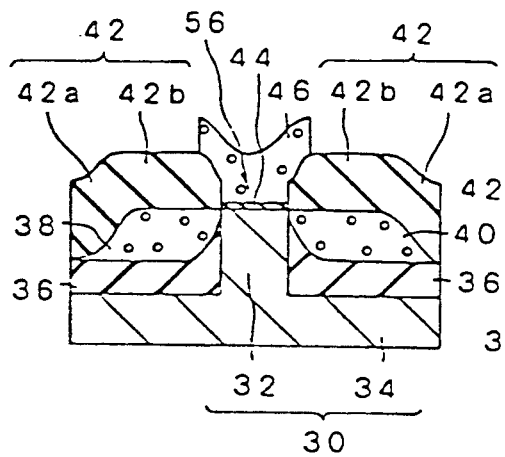
FIG_8 M
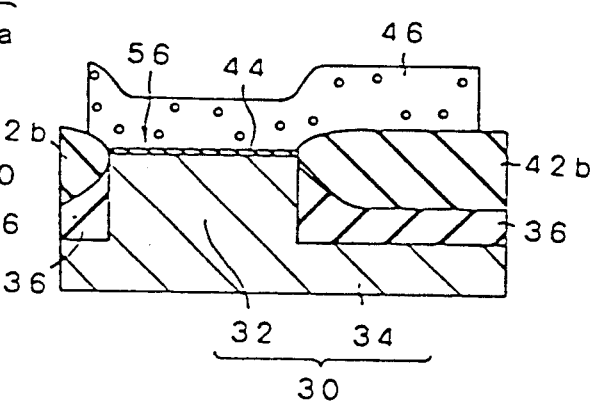
FIG_7 N
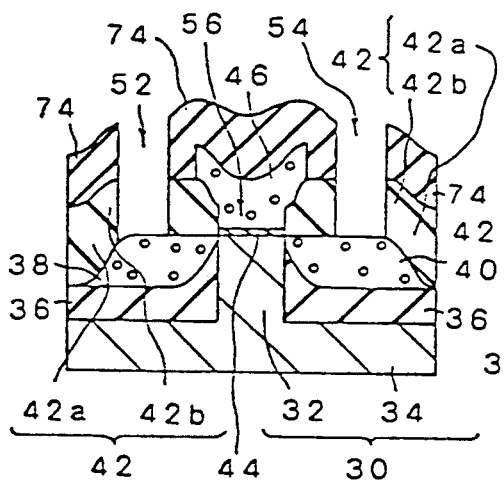
FIG_8 N
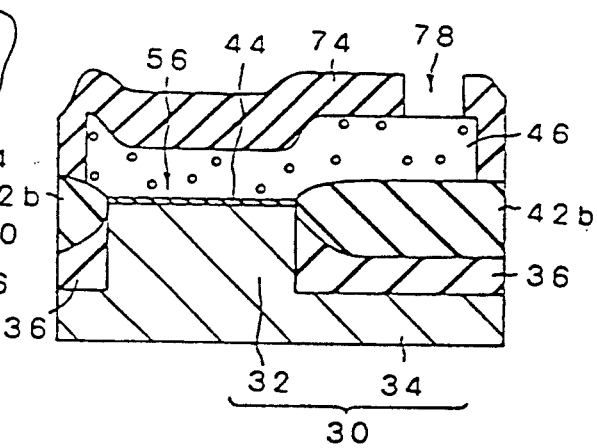
FIG_7 O
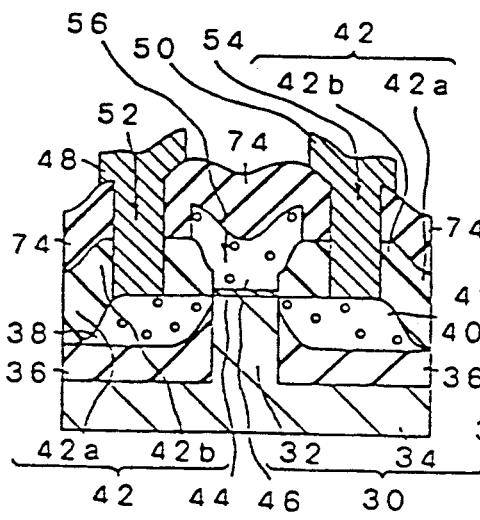
FIG_8 O
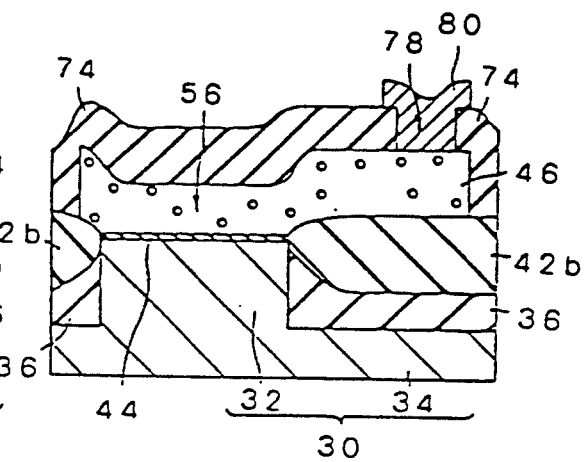

FIG_9 A
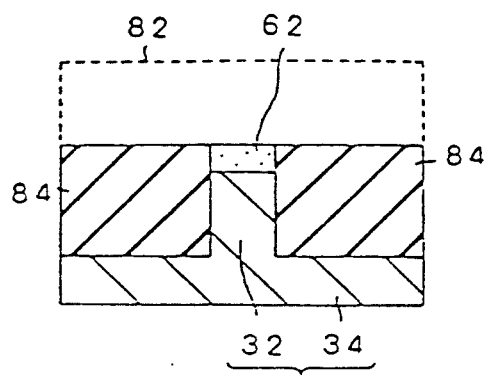
FIG_9 D
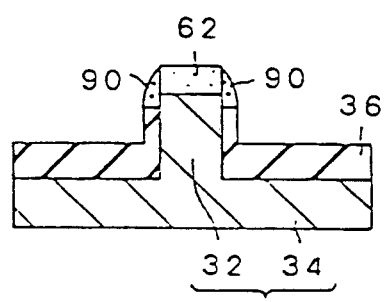
FIG_9 B
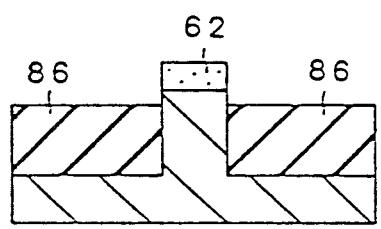
FIG_9 E
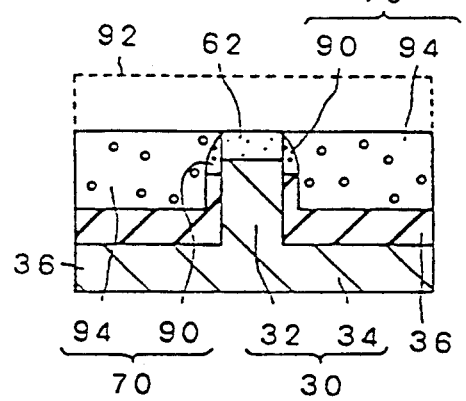
FIG_9 C
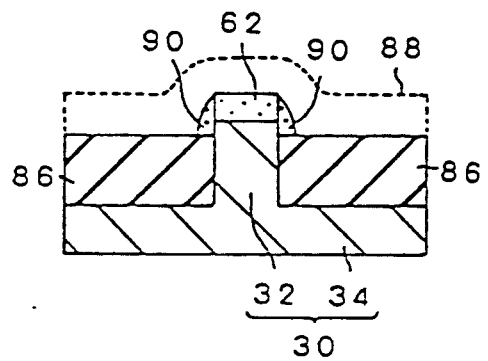
FIG_9 F
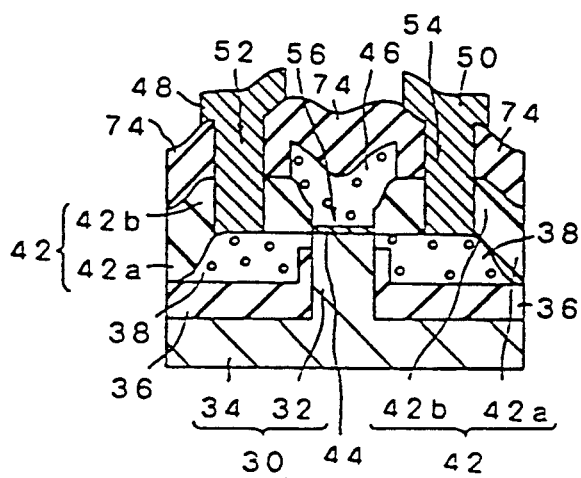

FIG_10 A
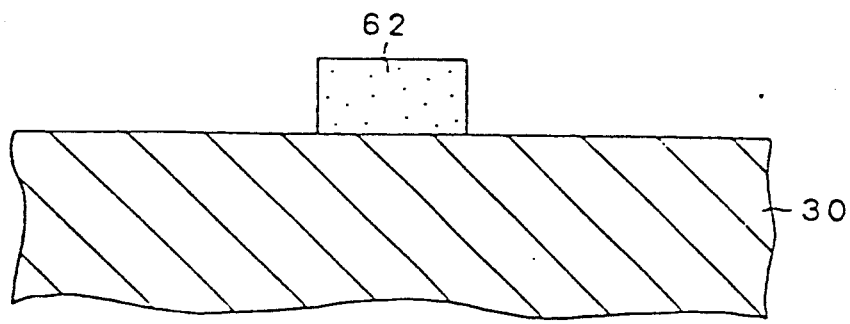
FIG_10 B
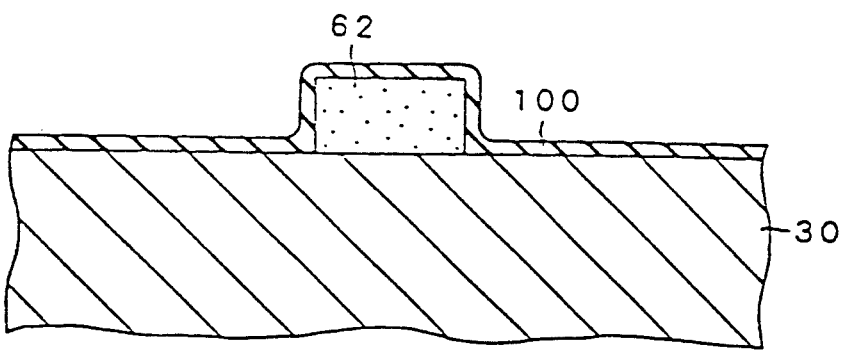
FIG_10 C
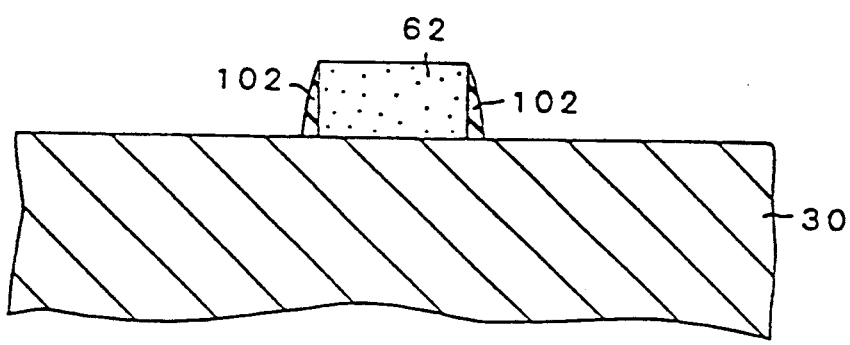

FIG_10 D
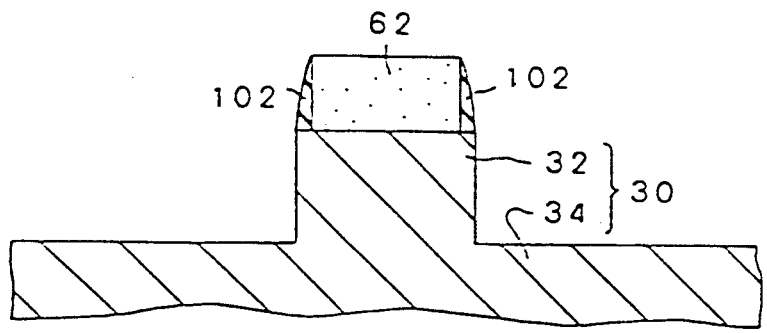
FIG_10 E
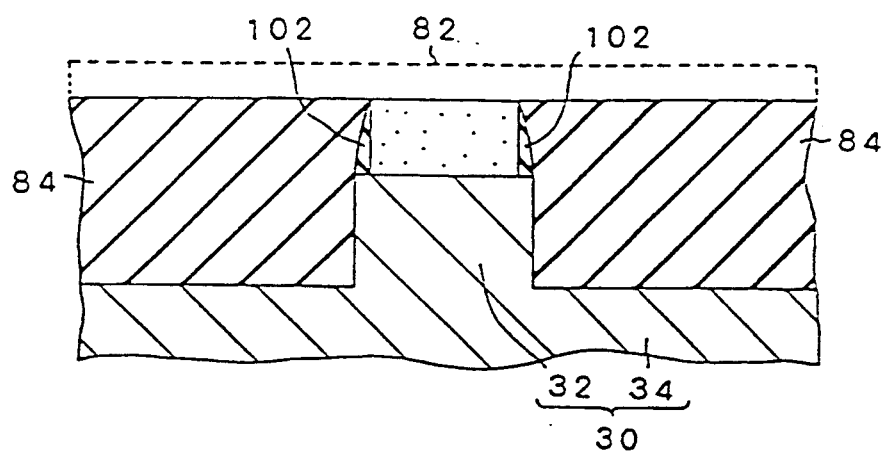
FIG_10 F
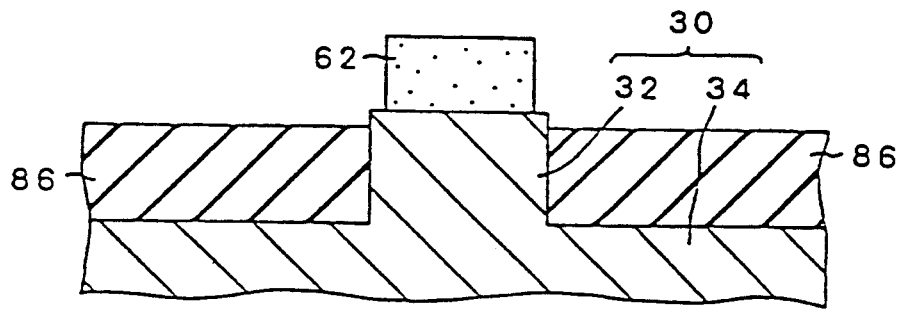

FIG_10 G
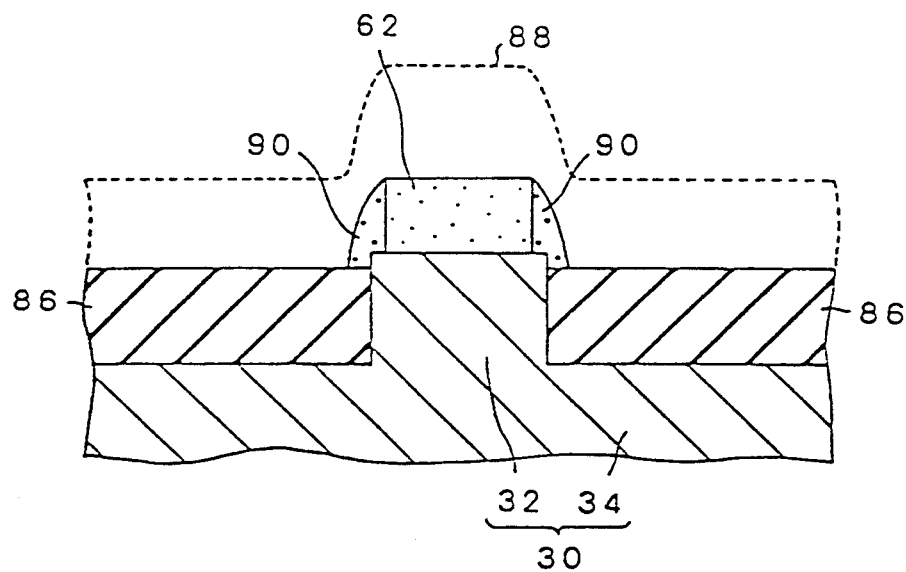
FIG_10 H
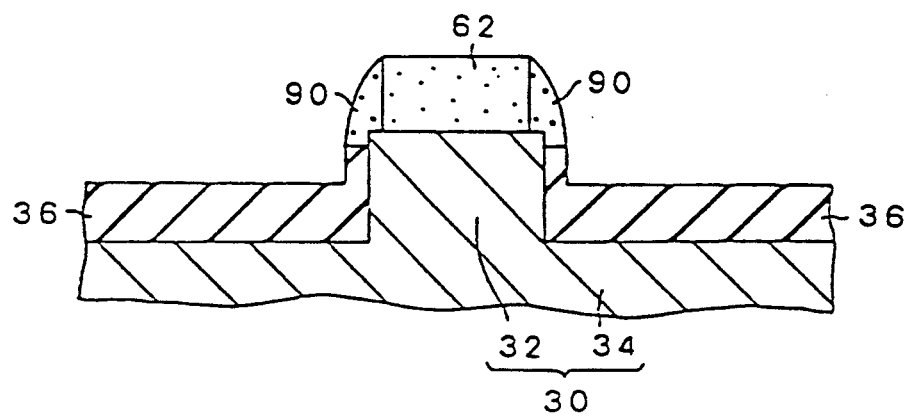

FIG_10 I
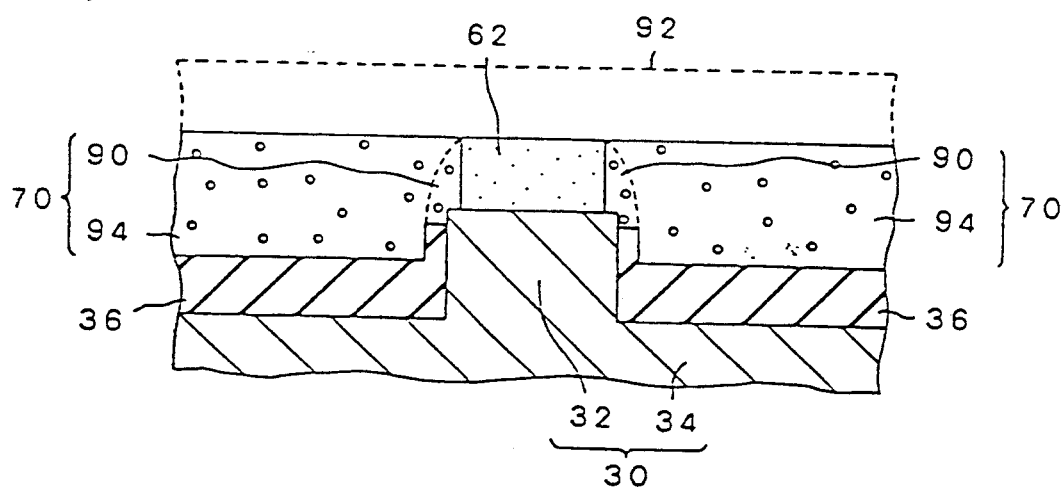
FIG_10 J
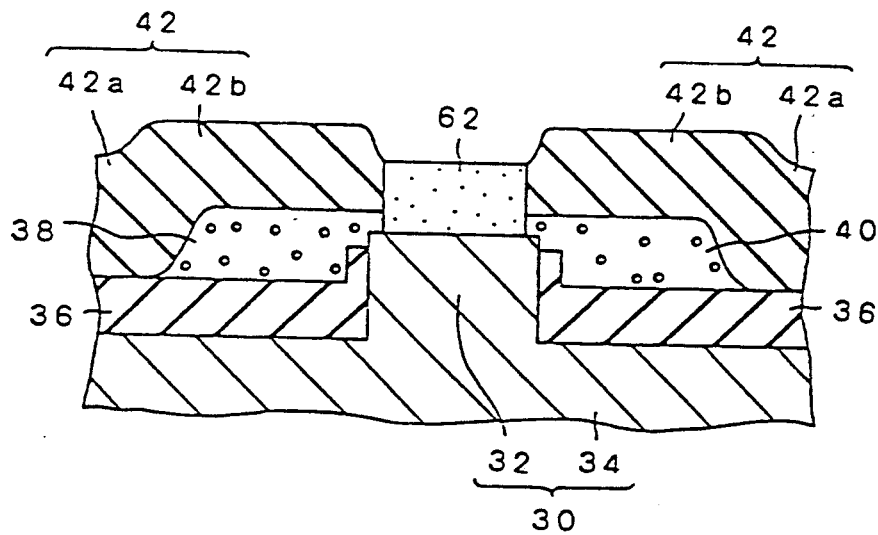

FIG_10 K
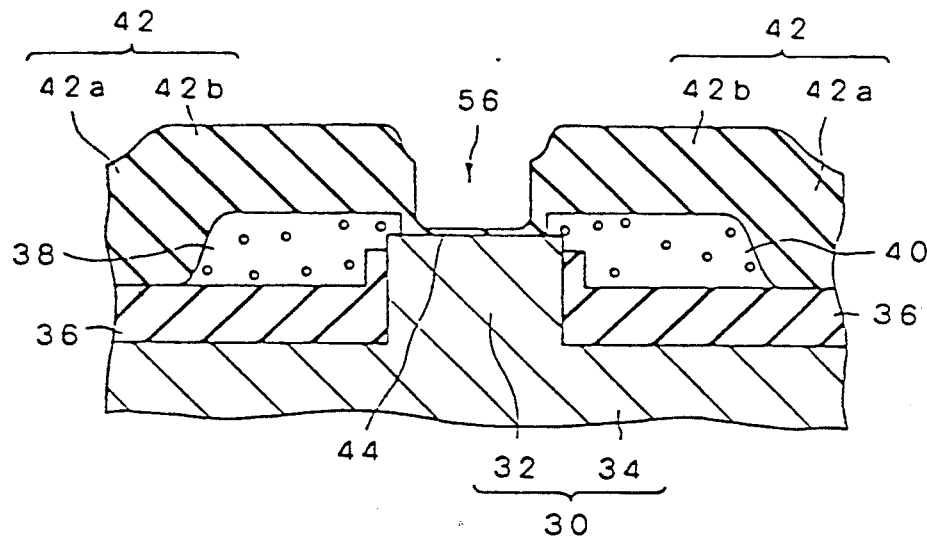
FIG_10 L
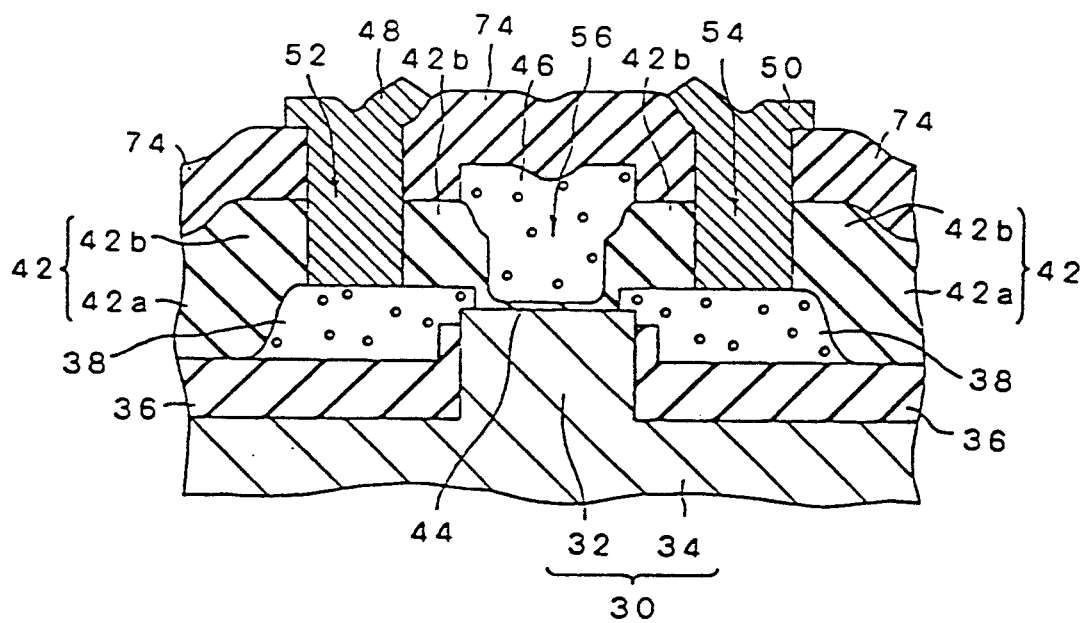

FIG_11 A
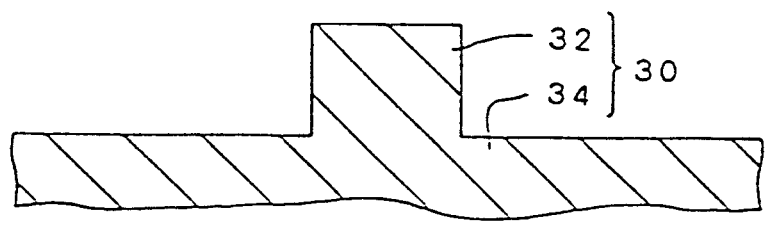
FIG_11 B
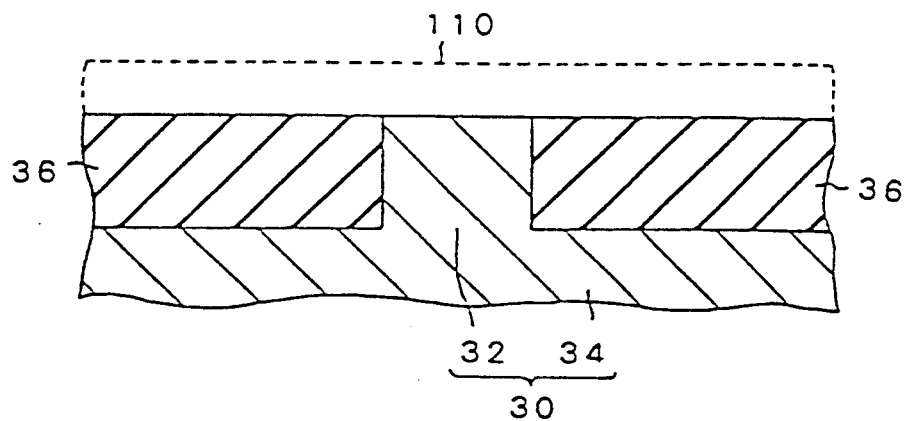
FIG_11 C
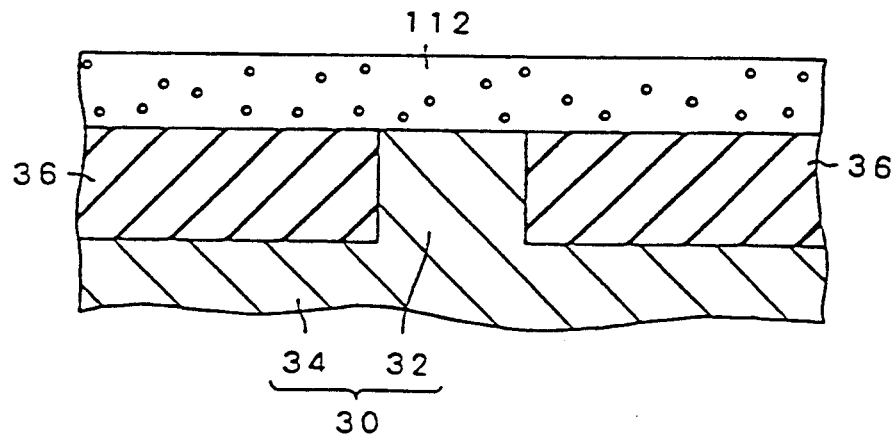

FIG_11 D
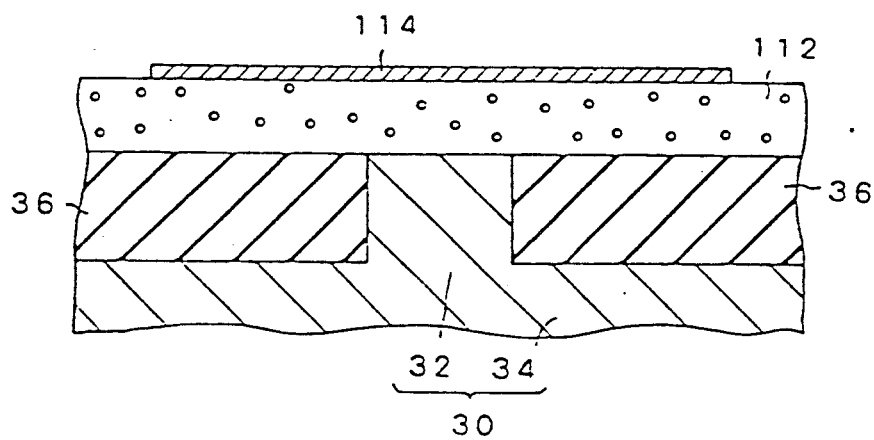
FIG_11 E
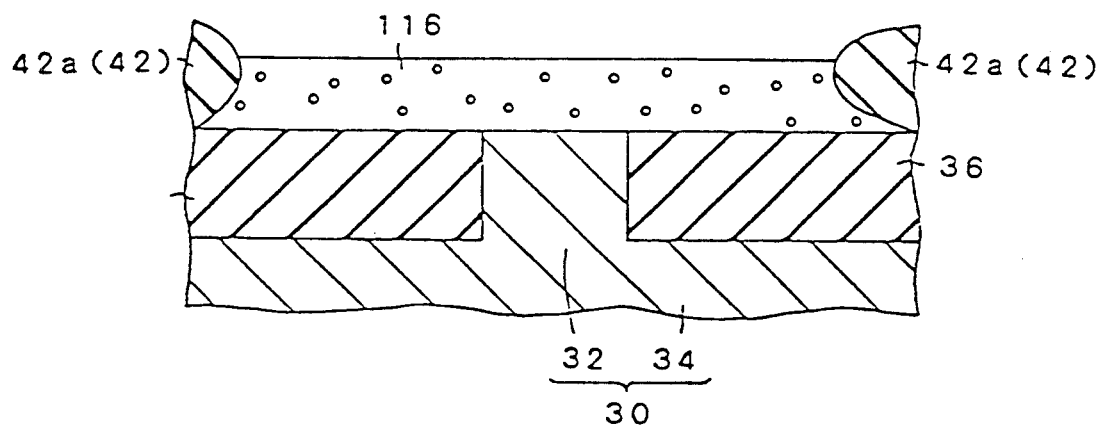
FIG_11 F
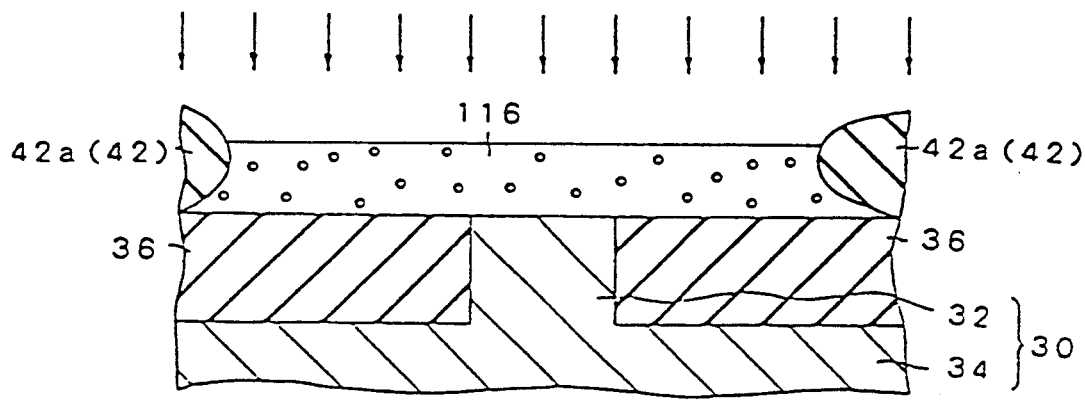

FIG_11 G
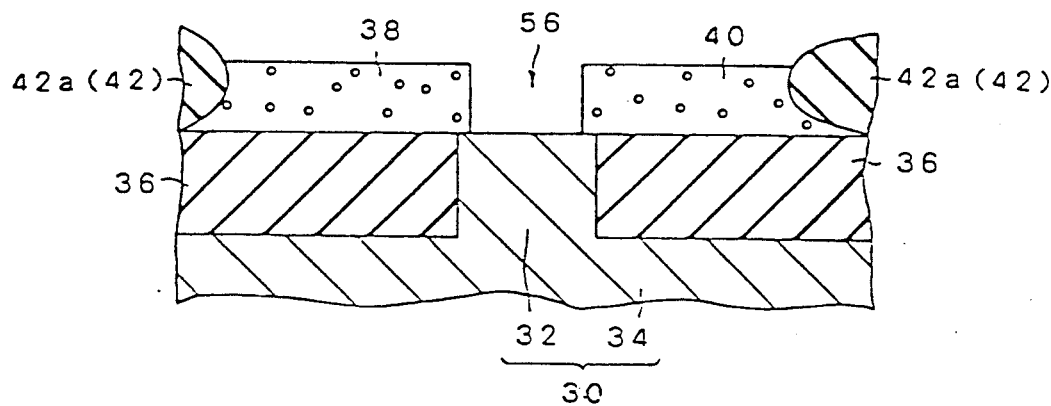
FIG_11 H
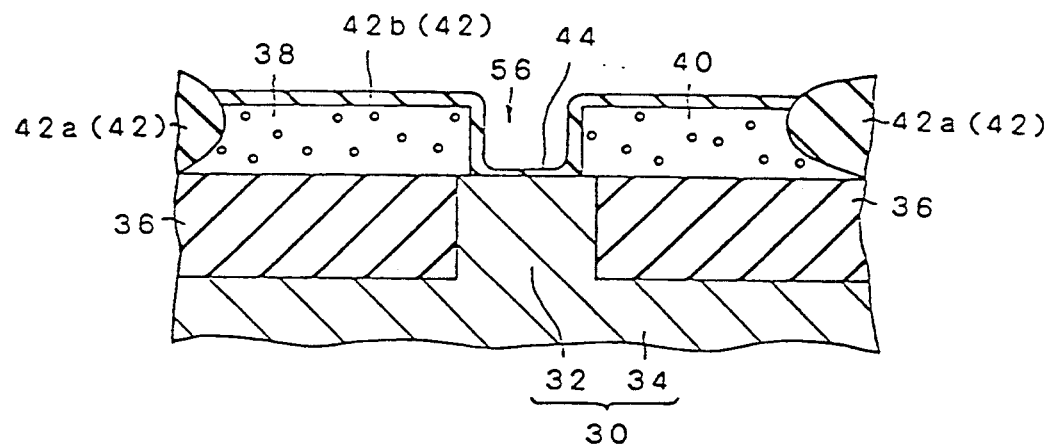
FIG_11 I
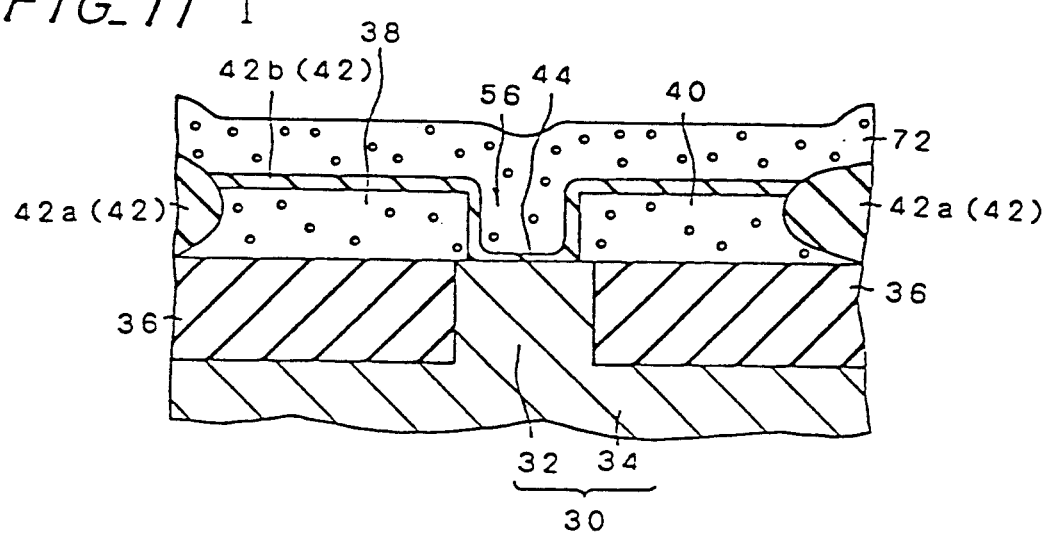

FIG_11 J
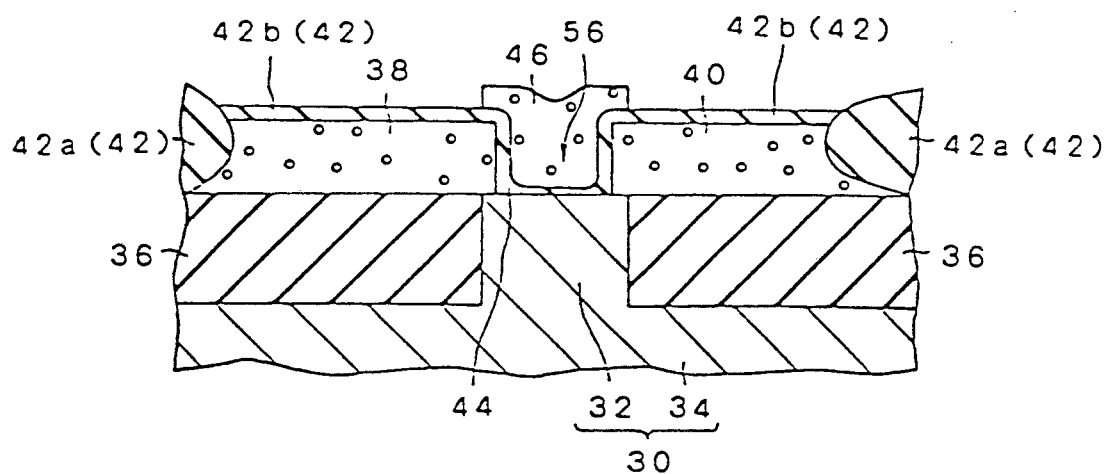
FIG_11 K
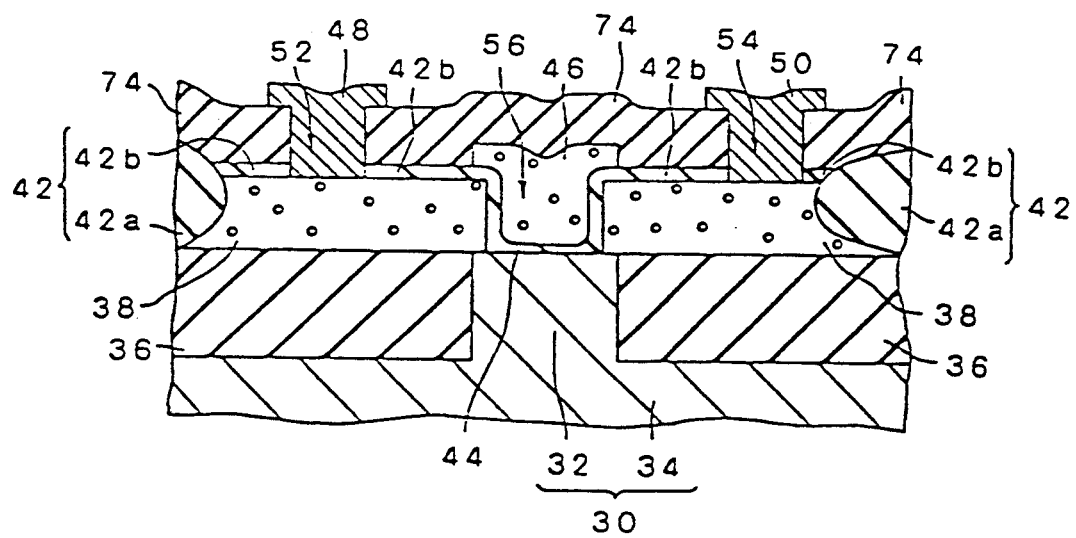

FIG_12 A
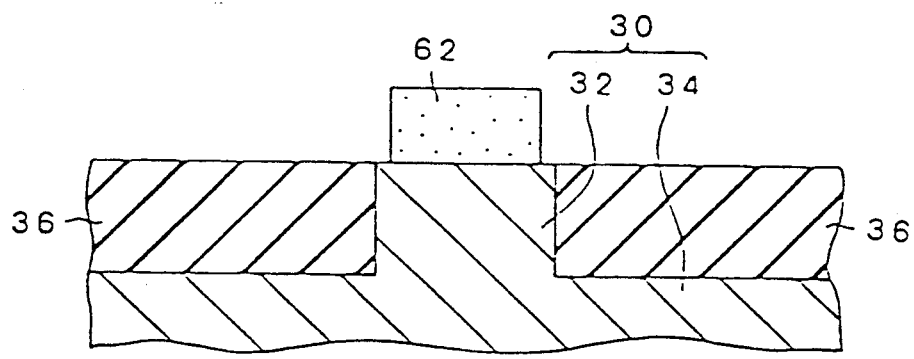
FIG_12 B
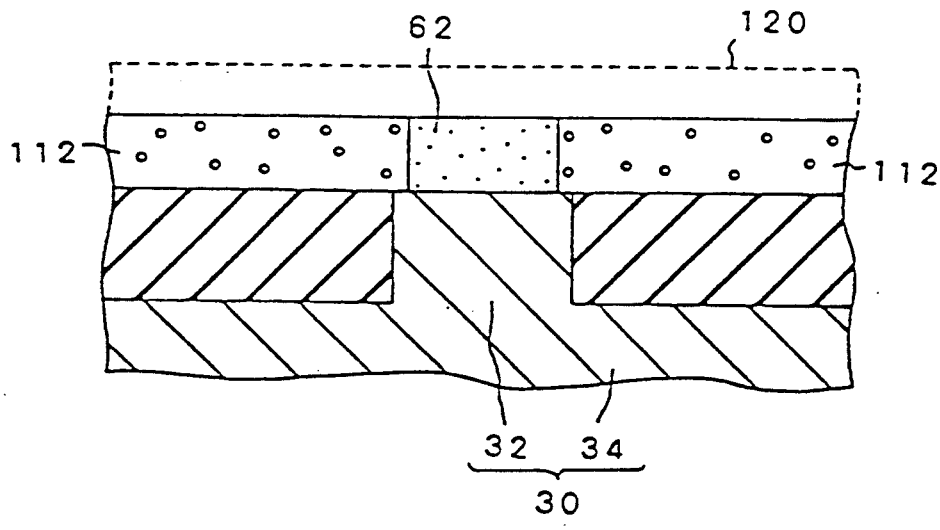

FIG_12 C
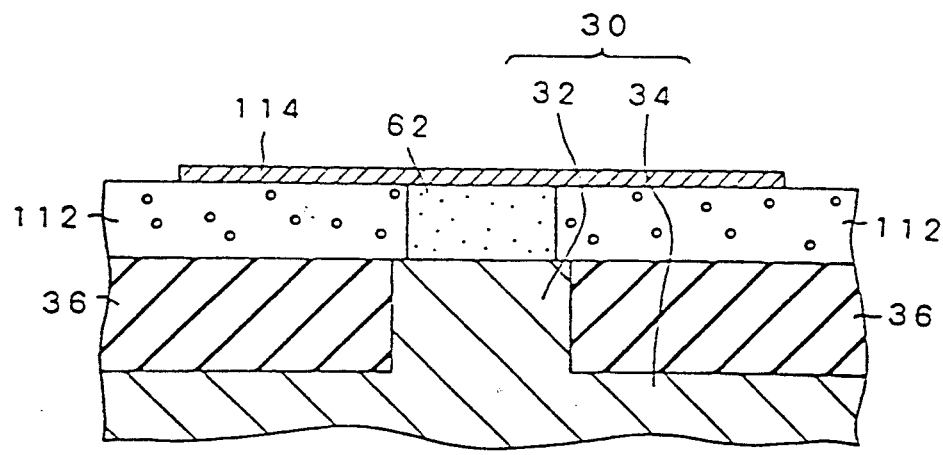
FIG_12 D
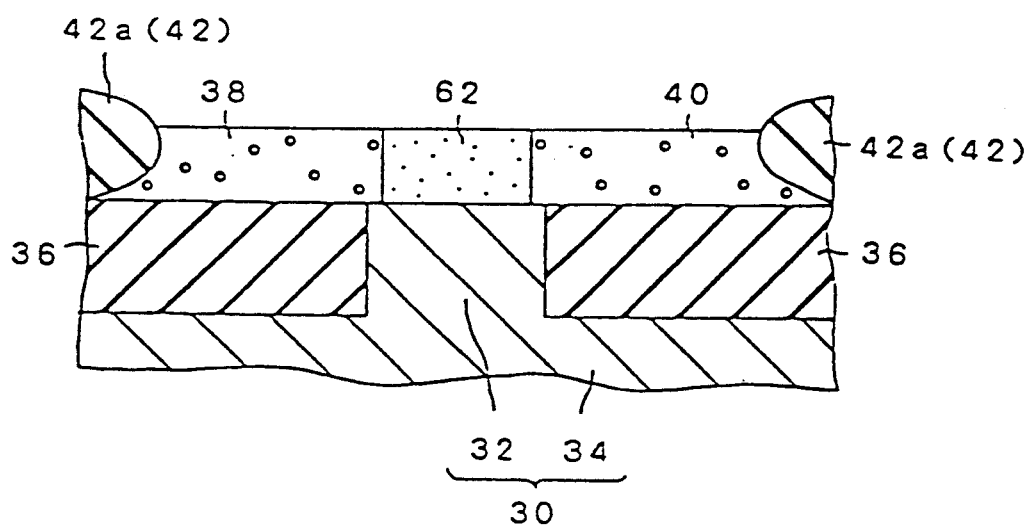

FIG_12 E
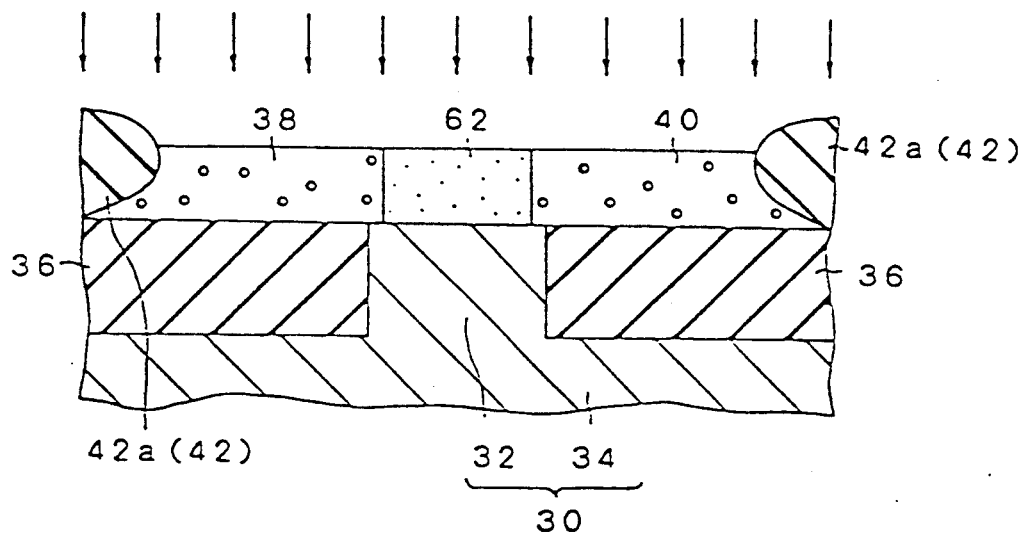
FIG_12 F
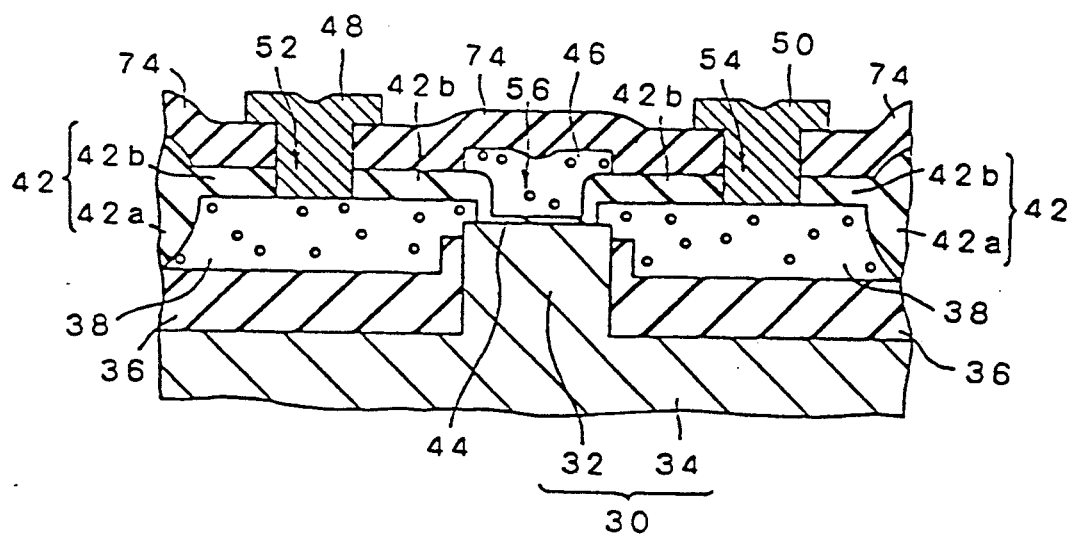

FIG_13 A
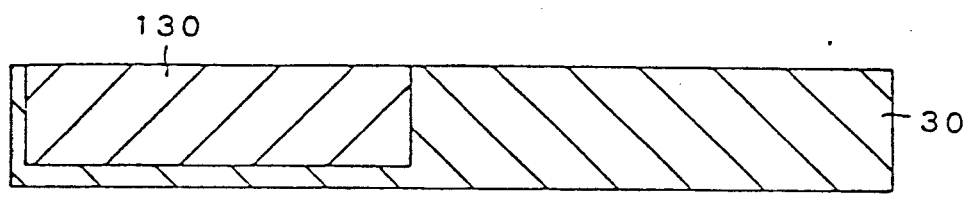
FIG_13 B
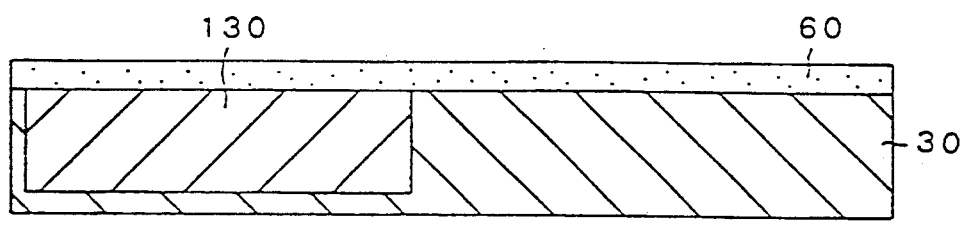
FIG_13 C
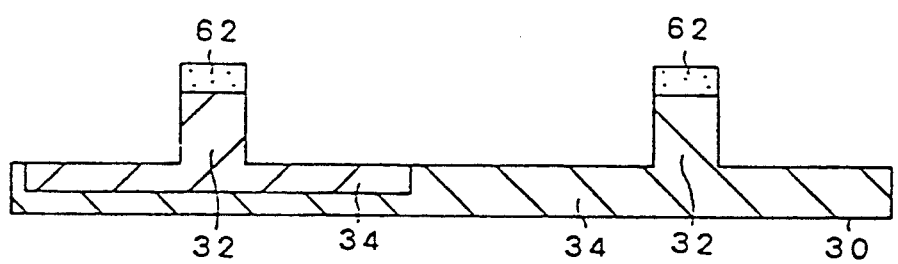
FIG_13 D
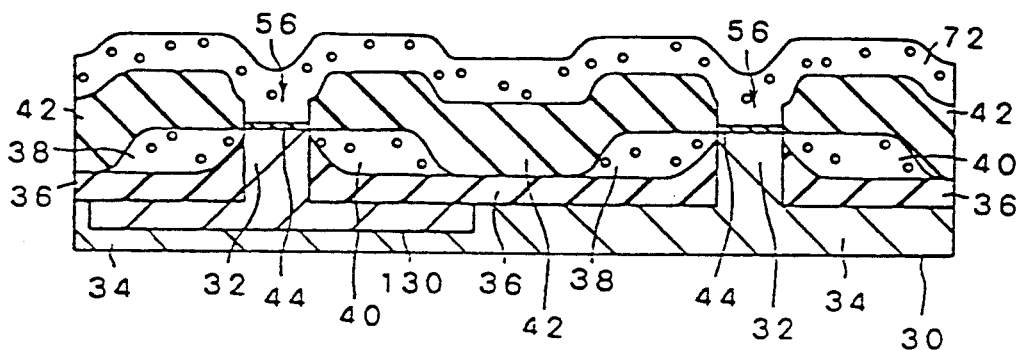

FIG._13 E
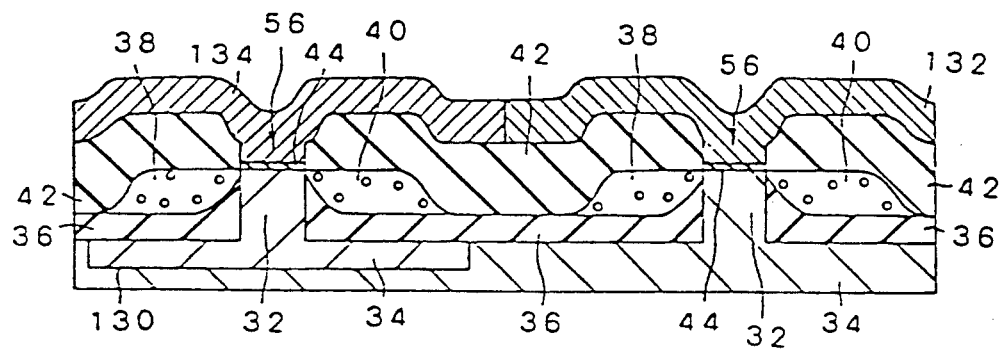
FIG._13 F
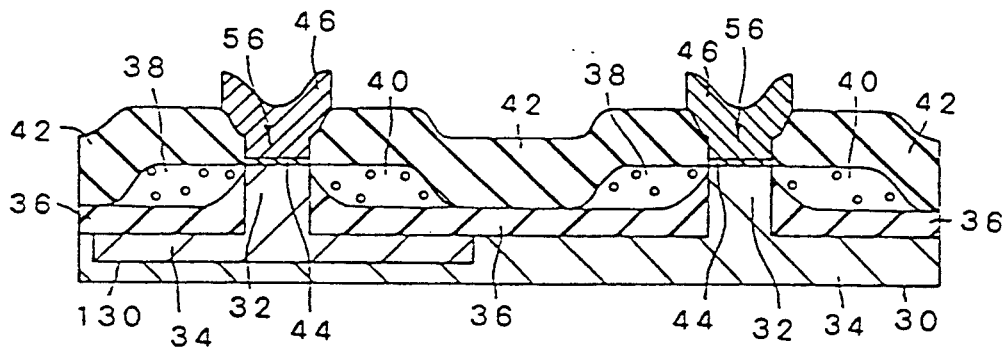
FIG._13 G
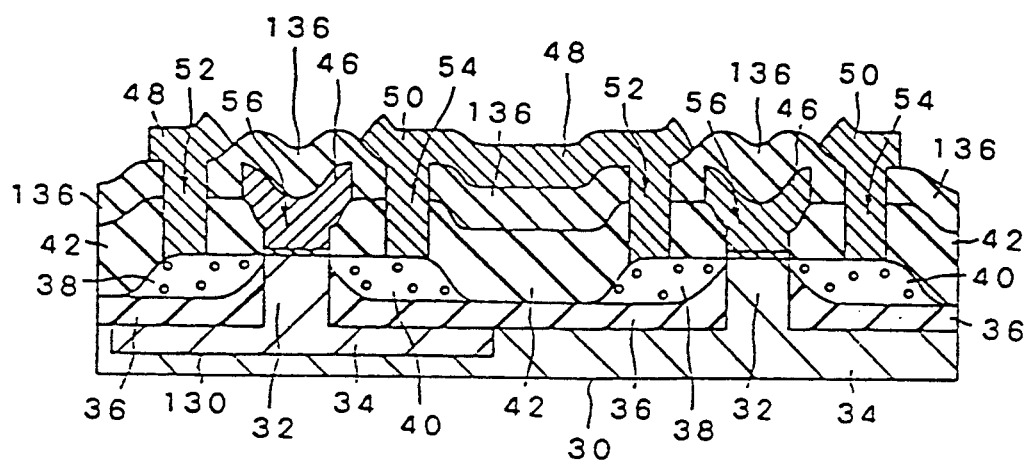

FIG_14 A
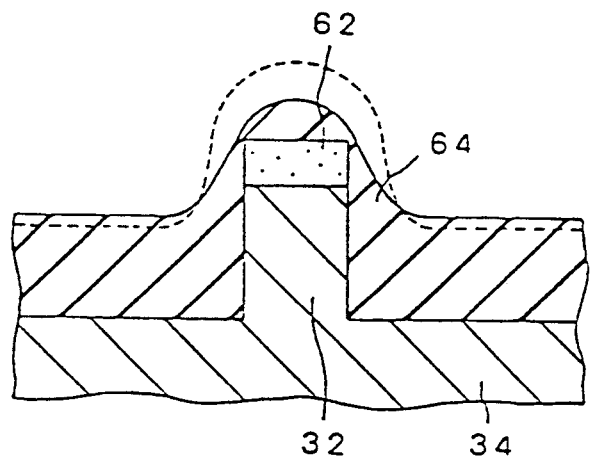
FIG_14 B
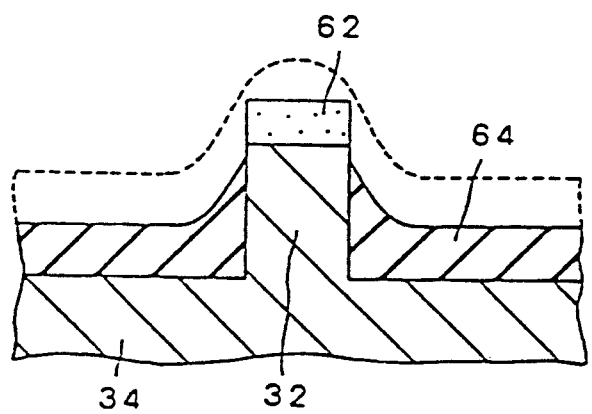

FIELD EFFECT TRANSISTOR

This is a continuation of application Ser. No. 07/550,687, filed Jul. 10, 1990, and now abandoned.

BACKGROUND OF THE INVENTION

1. Field of the Invention

The present invention relates to a field effect transistor (FET), particularly a MOSFET, well adapted for increases in the densities and speeds of integrated circuits, and a process for producing the same.

2. Prior Art

A brief description will first be made of the structure of a well known conventional MOSFET.

FIG. 1 is a schematic cross-sectional view of a typical example of the structure of a conventional MOSFET, the cross section of which is drawn along the lengthwise direction of a channel and perpendicular to the surface of a substrate. As is well known, this MOSFET is produced according to the following procedure. A field oxide film 12 and an inner oxide film 14 in a respective zone surrounded by the field oxide film 12 are formed through thermal oxidation of a silicon substrate 10 of a certain conductivity type. The whole surface of the oxide film 14 is then covered with a gate electrode metal according to a CVD method. The deposited gate electrode metal is patterned according to a photolithographic etching technology to form a gate electrode 16. The oxide film beneath the gate electrode 16 is to serve as a gate oxide film 18, as is well known. Using this gate electrode 16 as a mask, ion implantation of a suitable impurity is effected, followed by thermal diffusion of the implanted impurity ions to form first and second principal electrode regions (source/drain regions) 20 and 22. Contact holes are formed through the oxide film 14 (that may include an intermediate insulating film in the case where it is provided), followed by formation of first and second principal electrodes (source/drain electrodes) 24 and 26.

In the conventional structure of such a FET produced in the foregoing manner, however, the following problems in particular arise when the gate length is decreased in keeping with the increasing scale of integration and speed of an integrated circuit.

The first problem is a liability to a short channel effect.

The second problem is a liability to a punch through effect.

The third problem is increased influences on the characteristics of the device despite of a decreased junction capacitance in junctions between first and second principal electrode regions and a silicon substrate.

One solution to the first and second problems is a method of forming an LDD (lightly doped drain-source) structure in a semiconductor device. In the LDD structure, however, the electric resistance of the principal electrode regions (source/drain regions) is increased. Furthermore, when an attempt is made to solve the foregoing three problems and lower the electric resistance of the principal electrode regions, a difficulty is encountered in dimensional control in the course of production of a device.

An SOI (semiconductor on insulator) structure was proposed as a solution to the above-mentioned third problem. In this structure, the junction capacitance can be decreased, but a difficulty is encountered in forming the SOI structure itself.

An object of the present invention is to provide a field effect transistor having a structure wherein manifestation of the above-mentioned short channel effect and punch through effect can be suppressed as much as possible and the influence of the junction capacitance on the characteristics of the device can be suppressed as much as possible, while at the same time setting the electric resistance of the principal electrode regions thereof at a low level, and a process for producing the same.

SUMMARY OF THE INVENTION

In accordance with one aspect of the present invention, the above-mentioned object has been achieved by providing a field effect transistor comprising an underlayer having a protrusion wherein a channel is to be formed, a lower insulating layer, first and second principal electrode regions, an upper insulating layer, a gate electrode, a gate insulating film, and first and second principal electrodes;

wherein the lower insulating layer is provided on the underlayer in such a way as to substantially embed therein the protrusion and substantially surround the side wall of the protrusion;

wherein the first principal electrode region is provided on one side of the protrusion in the length-wise direction of a channel in such a way as to be in contact with part of the protrusion all along the length of the protrusion in the width-wise direction of the channel, while the second principal electrode region is provided on the other side of the protrusion in the length-wise direction of the channel in such a way as to be in contact with part of the protrusion all along the length of the protrusion in the width-wise direction of the channel;

wherein the first and second principal electrode regions are covered with the upper insulating layer and substantially defined by the set of the upper and lower insulating layers;

wherein the gate electrode is provided on the protrusion with the gate insulating film therebetween; and wherein the first and second principal electrodes are provided in contact with the first and second principal electrode regions, respectively, via respective contact holes formed through the upper insulating layer.

In the structure of the above-mentioned field effect transistor (sometimes referred to in brief as the "device" or "element") of the present invention, the underlayer has the protrusion wherein the channel is to be formed, and on the upper side of which the gate electrode is provided. The lower insulating layer is provided on the underlayer around the protrusion. On the upper side of the lower insulating layer, the first and second principal electrode regions are respectively positioned on the two sides of the protrusion in the length-wise direction of the channel. Parts of the principal electrode regions make a junction with the protrusion along the width-wise direction of the channel.

Accordingly, the device structure of the present invention provides the following effects.

(1) The junction capacitance between the principal electrode regions and the underlayer can be decreased since the lower sides of the principal electrode regions are in contact with the lower insulating layer and the area of junction between the principal electrode regions and the protrusion can be decreased by increasing the area of contact between the lower insulating layer and the protrusion. This is expected to contribute to a considerable improvement in the current derive efficiency of FETs.

(2) The electric resistance of the principal electrode regions can be decreased since the layer thickness of the principal electrode regions can be increased irrespective of the area of junction between the principal electrode regions and the protrusion.

(3) In the structure of the present invention, the principal electrode regions may be formed of poly-silicon (polycrystalline silicon). The diffusion of an impurity is sufficiently faster inside poly-silicon than inside single crystal silicon. Therefore, even when diffusion of an impurity is effected in the production process to decrease the electric resistance of the principal electrode regions, no substantial diffusion of the impurity toward the lower side of the gate electrode occurs. Further, the area of junction between the principal electrode regions and the protrusion is small in the structure of the present invention, as described above. As a result, the structure can have a very thin impurity diffusion layer on the lower side of the gate electrode.

Accordingly, manifestation of the short channel effect and the punch through effect can be effectively suppressed in the structure of the present invention.

(4) According to the structure of the present invention, since the principal electrode regions are in contact with the underlayer substrate in the vicinity of the channel, the electrical distance between devices on the side of the substrate is mainly determined by the interval between protrusions and the height thereof, not by the size of the principal electrode regions as in the case of conventional structures. Accordingly, the distance in plan for isolation can be shortened as compared with those in the conventional structures. Furthermore, since the principal electrode regions are formed on the insulating region, the insulation of the principal electrode regions from those in adjacent devices can be simply effected independently of isolation on the side of the substrate.

As will be understood from the above, the shape of device formation including the isolation region can be decreased in the structure of the present invention, which can therefore contribute to the scale-up of integration of an integrated circuit and is easy of isolation. Particularly when the structure of the present invention is utilized to form a CMOS structure, therefore, the adverse influences of poor isolation on the characteristics, involving latch-up of a circuit can be eliminated to greatly contribute to an increase in the performance of the circuit.

The height of the protrusion can be arbitrarily set in accordance with designing irrespective of the area occupied in plan by the device to allow the width of vertical isolation to be arbitrarily set. However, the height of protrusion is preferably large.

In carrying out the present invention, the two principal electrode regions are brought into contact with the side wall and/or upper surface of the protrusion of the underlayer all along the total length of the protrusion in the width-wise direction of the channel, while the length of contact in a direction perpendicular to the width-wise direction of the channel between the principal electrode regions and the protrusion can be arbitrarily set in accordance with designing. The locations of contact can also be arbitrarily set in accordance with designing.

In carrying out the present invention, however, it is preferable that the first and second principal electrode regions be in contact with the protrusion in the vicinity of the upper end edge thereof, and that the area of contact be so small that the contact resistance does not adversely affect the operational characteristics of the field effect transistor. In this case, the area of junction can advantageously be decreased without any adverse influences on the characteristics of the device.

Thus, the first and second principal electrode regions may be brought into contact with, for example, the upper end edge and side wall of the protrusion.

Alternatively, the first and second principal electrode regions may be brought into contact with, for example, the upper end edge and upper surface of the protrusion.

Further alternatively, the first and second principal electrode regions may be brought into contact with the upper end edge, side wall and upper surface of the protrusion.

In carrying out the present invention, it is preferable to use polycrystalline silicon (hereinafter referred to as "poly-silicon") as the base material of the first and second electrode regions. In this case, a thermal oxidation treatment of poly-silicon can advantageously form the upper insulating layer including a silicon oxide film for the electrical isolation, while at the same time defining the extension (active area) encompassing the principal electrode regions on the surface of the underlayer and setting the thickness of the principal electrode regions.

Alternatively, it is preferable to form an oxidation-proofing film pattern on the layer of poly-silicon, the exposed area of which is oxidized to form a silicon oxide film for electrical isolation, which film constitutes part of the upper insulating layer. In this case, the extension (active area) encompassing the principal electrode regions on the surface of the principal electrode regions can be defined, but the thickness of the principal electrode regions is substantially determined by the thickness of the original poly-silicon layer.

According to a preferred embodiment of the present invention, the lower insulating layer can be formed of PSG (phospho-silicate glass), BPSG (PSG containing boron), or $SiO_2$. When the lower insulating layer is to be formed of PSG or BPSG, a flow of the material of the lower insulating layer, caused by heat, can be utilized to set the thickness of the lower insulating layer on the underlayer, particularly the thickness of the lower insulating layer in the area thereof in contact with the protrusion. Accordingly, the area of contact between the principal electrode regions made of poly-silicon and the protrusion on the upper side of the lower insulating layer can advantageously be arbitrarily controlled in accordance with designing by controlling the thickness of the lower insulating layer in the area thereof in contact with the protrusion. When the lower insulating layer is to be formed of a $SiO_2$-containing material, the thickness of the lower insulating layer in the area thereof in contact with the protrusion as well as the area of contact between the principal electrode regions and the protrusion can advantageously be arbitrarily controlled by a combination of simple CVD and etching back technologies.

In accordance with another aspect of the present invention, there are provided the following processes for producing a field effect transistor.

The first process of the present invention for producing a field effect transistor comprises:

the first step of forming a dummy film pattern on the upper surface of an underlayer;

the second step of etching the underlayer using the dummy film pattern as a mask to form a protrusion for a channel region;

the third step of forming a lower insulating layer in contact with the side wall of the protrusion on the underlayer and around the protrusion;

the fourth step of forming a poly-silicon layer with a height making the upper surface thereof flush with the upper surface of the dummy film pattern and partially in contact with the protrusion all over the surface of the lower insulating layer by utilizing a poly-silicon etching-back technology;

the fifth step of thermally oxidizing the poly-silicon layer to define first and second principal electrode regions while at the same time forming a thermally-oxidized film constituting an upper insulating layer;

the sixth step of removing the dummy film pattern to expose the upper surface of the protrusion;

the seventh step of forming a gate insulating film on the upper surface of the protrusion;

the eighth step of forming a gate electrode on the gate insulating film;

the ninth step of forming contact holes through the upper insulating layer; and the tenth step of forming first and second principal electrodes, via the contact holes, in contact with the first and second principal electrode regions, respectively.

According to the first process of the present invention, the dummy film pattern is first formed and used as the mask, with which the protrusion of the underlayer is formed. The gate electrode can be formed on the upper surface of the protrusion in self-alignment with the protrusion. Therefore, the deterioration of the characteristics of the device, which would otherwise be attributed to the dimensional and positional nonalignment of the gate electrode with the protrusion of the underlayer wherein a channel is to be formed, can be suppressed to be minimal.

Further, according to the first process of the present invention, after the formation of the protrusion of the underlayer, the lower insulating layer is formed around the protrusion of the underlayer, followed by formation thereon of the poly-silicon layer. Thereafter, the poly-silicon layer is thermally oxidized to simultaneously form the principal electrode regions and the silicon oxide film constituting the upper insulating layer. When the silicon oxide film reaches the lower insulating layer to form a connection therebetween, therefore, poly-silicon regions remaining without undergoing thermal oxidation can be used as the principal electrode regions. Accordingly, simultaneous formation of the device-isolating region and the principal electrode regions can be achieved through the thermal oxidation treatment of the poly-silicon layer even without customary preliminary formation of a field oxide film for isolation of a device in the underlayer. Furthermore, since the area of the device-isolating portion of the upper insulating layer can be narrowed, the scale of integration of an integrated circuit can be increased as compared with those in the prior art.

Furthermore, the efficiency of vertical isolation can be increased by appropriately setting the height of the protrusion to allow an integrated circuit to be increased in density.

Since the principal electrode regions may be formed of poly-silicon, a decrease in the electric resistance of the principal electrode regions can be easily achieved through ion implantation and thermal diffusion by utilizing a faster impurity diffusion rate inside poly-silicon than that inside single crystal silicon. It is especially effective that the decreasing of the electric resistance of the principal electrode regions is effected after the formation of the contact holes for wiring or interconnection.

Further, when the impurity diffusion into the principal electrode regions formed of poly-silicon can be effected just before a wiring or interconnection operation, unnecessary impurity diffusion from the principal electrode regions toward the lower side of the gate electrode can be suppressed to be minimal. This is expected to be very effective in suppressing the short channel effect and the punch through effect.

In producing a FET of first structure according to the first process of the present invention, it is preferable that the fifth step comprise the substep of etching the poly-silicon layer partially in the thickness-wise direction thereof except for the following two principal electrode regions to preliminarily define the first principal electrode region on one side of the protrusion in the length-wise direction of the channel and the second principal electrode region on the other side of the protrusion in the length-wise direction of the channel, and the substep of thermally oxidizing the poly-silicon layer remaining after the etching.

According to the foregoing preferred embodiment of the first process, thermal oxidation of the poly-silicon layer can be effected in such a way as to leave poly-silicon regions to constitute the principal electrode regions while joining the lower insulating layer with the upper insulating layer to serve as the element-isolated region.

In producing the FET of first structure according to the first process of the present invention, it is preferable that the third step comprise the substep of forming a PSG or BPSG film on the underlayer including the protrusion, the substep of flowing the PSG or BPSG film into a predetermined shape by heating, and the substep of wet-etching the shaped PSG or BPSG film.

According to the foregoing preferred embodiment of the first process, when wet etching of the PSG or BPSG film is effected with the thickness of the PSG or BPSG film on the upper surface of the protrusion being adequately set, the exposed area of the side wall of the protrusion on the upper end edge side thereof can be suitably set, while at the same time decreasing the thickness of the PSG or BPSG film apart from the protrusion. Accordingly, the area of junction between the protrusion of the underlayer and the principal electrode regions to be formed in the later step can be set small substantially in accordance with designing to decrease the junction capacitance, while at the same time the thickness of the principal electrode regions in their areas apart from their contact areas (also referred to as the "areas of junction" or "junctions") can be made large to decrease the electric resistance in the former areas.

In producing the FET of first structure according to the first process of the present invention, it is preferable that the fourth step comprise the substep of forming a preliminary poly-silicon film on the whole upper surface including the upper surfaces of the lower insulating layer and the dummy film pattern, and the substep of etching back the preliminary poly-silicon film to make the upper surface thereof flush with the upper surface of the dummy film pattern.

According to the foregoing preferred embodiment of the first process, the upper surface of the poly-silicon layer formed through etching back can be precisely flush with the upper surface of the dummy film pattern.

In this case, etching back may be effected after planarization of the upper surface of the preliminary poly-silicon film or after formation of a film of a resist, equal in etching rate to poly-silicon, on the preliminary poly-silicon film to planarize the whole upper surface.

In producing a FET of second structure according to the first process of the present invention, it is preferable that the third step comprise the substep of forming an $SiO_2$-containing film with the upper surface thereof flush with the upper surface of the dummy film pattern on the underlayer by utilizing an $SiO_2$ etching-back technology, the substep of etching the $SiO_2$-containing film down to such s depth as to make the upper surface thereof reach a level midway along the protrusion in the height-wise direction thereof to expose the side the dummy film pattern and part of the side wall of the protrusion, the substep of forming a poly-silicon side wall on the exposed side wall of the protrusion by utilizing a poly-silicon anisotropic etching technology, and the substep of further etching the remaining $SiO_2$-containing film down to such a depth as to make the upper surface thereof reach a level lower than the above-mentioned level but still midway along the protrusion in the height-wise direction thereof while using the dummy film pattern and the poly-silicon side wall as a mask to form the lower insulating layer.

According to the foregoing preferred embodiment of the first process, the areas of junction between the protrusion of the underlayer and the principal electrode regions can be formed with an increased certainty though the production of the FET of second structure involves the somewhat complicated step as compared with the production of the aforementioned FET of first structure. Additionally stated, the term "$SiO_2$-containing film" is intended to encompass a film of $SiO_2$ alone and a film of a material containing $SiO_2$, such as PSG, BPSG or silicate glass.

In producing the FET of second structure according to the first process of the present invention, it is preferable that the fourth step comprise the substep of forming poly-silicon film with a thickness making the upper surface thereof flush with the upper surface of the dummy film pattern on the whole upper surface of the lower insulating layer formed in the foregoing third step by utilizing a poly-silicon etching-back technology, whereby the above-mentioned poly-silicon film and the poly-silicon side wall constitutes the poly-silicon layer.

According to the foregoing preferred embodiment of the first process, poly-silicon side wall portions of the poly-silicon layer constitute the substantial areas of junction between the principal electrode regions and the protrusion of the underlayer, while the poly-silicon films formed later serve as the substantial principal electrode regions. Accordingly, the area of junction can be minimized at the time of forming the poly-silicon side wall, while the thickness of the poly-silicon films can be set large to decrease the electric resistance of the principal electrode regions.

In producing the FET of either first or second structure according to the first process of the present invention, the protrusion of the underlayer is formed using the dummy film pattern as the mask. This enables the gate electrode to be formed in self-alignment with the protrusion in the later step.

In producing a FET of third structure according to the first process of the present invention, it is preferable that the second step comprise the substep of forming an $SiO_2$-containing film on the whole upper surface including the dummy film pattern according to a CVD method, the substep of dry-etching the $SiO_2$-containing film to form an $SiO_2$-containing side wall around the dummy film pattern, and the substep of etching the underlayer using the dummy film pattern and the $SiO_2$-containing side wall as a mask.

The above-mentioned second step is taken to provide the FET with such a structure that the principal electrode regions have a junction at least with part of the upper surface of the protrusion of the underlayer. Furthermore, since the thickness of the $SiO_2$-containing side wall is determined by the thickness of the $SiO_2$-containing film formed by the CVD method, the area of junction between the principal electrode regions and the upper surface of the protrusion can be arbitrarily set by controlling the thickness of the above-mentioned $SiO_2$-containing film. Moreover, the gate electrode can be formed in a location vacated by removal of the dummy film pattern in self-alignment therewith In producing the FET of third structure according to the first process of the present invention, it is preferable that the third step comprise the substep of forming a preliminary $SiO_2$-containing film with a thickness making the upper surface thereof flush with the upper surface of the dummy film pattern on the underlayer by utilizing an $SiO_2$ etching-back technology after the above-mentioned second step, the substep of etching the preliminary $SiO_2$-containing film and $SiO_2$-containing side wall while using the dummy film pattern as a mask to remove the above-mentioned $SiO_2$-containing side wall while at the same time removing a portion of the preliminary $SiO_2$-containing film ranging from a level flush with the upper surface of the protrusion to a midway level along the protrusion in the height-wise direction thereof to expose parts of the side wall and upper surface of the protrusion while allowing part of the preliminary $SiO_2$-containing film to remain intact, the substep of forming a poly-silicon side wall covering the exposed side wall and upper surface of the protrusion on the upper side of the remaining preliminary $SiO_2$-containing film by utilizing a poly-silicon anisotropic etching technology, and the substep of further etching the remaining preliminary $SiO_2$-containing film down to a depth lower than the above-mentioned midway level but still midway along the protrusion in the height-wise direction thereof while using the dummy film pattern and the poly-silicon side wall as a mask to form the lower insulating layer.

According to the foregoing preferred embodiment of the first process, the exposed area of the side wall of the protrusion of the underlayer is determined by the etching depth in etching-back of the preliminary $SiO_2$-containing film. Accordingly, the area of junction between the principal electrode regions and the side wall of the protrusion can be set small by controlling the above-mentioned etching depth to decrease the junction capacitance.

In this case, since the preliminary $SiO_2$-containing film is etched using the poly-silicon side wall as part of the mask to form the lower insulating layer, this lower insulating layer is thick in an area around the protrusion and thin in the area apart from the protrusion. Accordingly, the thickness of the principal electrode regions to be formed in the later step can be large in the area apart from the protrusion to decrease the electric resistance of the principal electrode regions.

In producing the FET of third structure according to the first process of the present invention, it is preferable that the fourth step comprise the substep of forming a poly-silicon film with a thickness making the upper surface thereof flush with the upper surface of the dummy film pattern by utilizing a poly-silicon etching-back technology after the above-mentioned third step, whereby the poly-silicon film and the present invention poly-silicon side wall constitute the poly-silicon layer.

According to the foregoing preferred embodiment of the first process, since the poly-silicon side-wall is to constitute parts of the principal electrode regions, there is provided such a structure that the principal electrode regions are in contact with the corner of the protrusion of the underlayer, namely parts of the upper surface and side wall of the protrusion of the underlayer. This allows various precision margins to be large in the step of forming the gate electrode.

The poly-silicon side wall is to constitute substantial junctions between the principal electrode regions and the protrusion.

Furthermore, when the poly-silicon layer is thermally oxidized in the later step, poly-silicon regions to constitute the principal electrode regions can be left intact while at the same time joining the lower insulating layer with part of the upper insulating layer to constitute the isolation region.

In the first process of the present invention, it is preferable that the process comprise the step of effecting ion implantation to decrease the electric resistance of the first and second principal electrode regions between the fifth and sixth steps or between the ninth and tenth steps.

In this case, the ion implantation coupled with the large thickness of the principal electrode regions, can further decrease the electric resistance of the principal electrode regions.

The second process of the present invention for producing a FET of fourth structure comprises:

the first step of etching an underlayer to form a protrusion for a channel region;

the second step of forming an $SiO_2$-containing film with a thickness making the upper surface thereof flush with the upper surface of the protrusion and in contact with the side wall of the protrusion as a lower insulating layer on the underlayer around the protrusion by utilizing an $SiO_2$ etching-back technology;

the third step of forming a poly-silicon layer having a planarized upper surface on the whole upper surface including the upper surfaces of the lower insulating layer and the protrusion;

the fourth step of forming a thermal oxidation-proofing film on an area of the poly-silicon layer which area covers the protrusion in the length-wise direction of a channel and wherein first and second principal electrode regions are to be formed;

the fifth step of thermally oxidizing the poly-silicon layer to form an isolation oxide film to constitute part of an upper insulating layer while at the same time defining a poly-silicon the first and second principal electrode regions;

the sixth step of removing the thermal oxidation-proofing film;

the seventh step of effecting ion implantation to decrease the electric resistance of the above-mentioned poly-silicon region;

the eighth step of forming a gate opening with a length equal to that of protrusion in the width-wise direction of the channel and with a width shorter than the width of the protrusion in the length-wise direction of the channel through the poly-silicon region in an area thereof located on the upper side of the protrusion to divide the poly-silicon region into the first and second principal electrode regions;

the ninth step of forming an insulating film to constitute the other part of the upper insulating layer on the exposed surfaces of the first and second principal electrode regions and forming a gate insulating film on the upper surface of the protrusion;

the tenth step of forming a gate electrode on the gate insulating film;

the eleventh step of forming contact holes through the upper insulating film; and the twelfth step of forming first and second principal electrodes, via the contact holes, in contact with the first and second principal electrode regions, respectively.

According to this second process, the flat lower insulating layer with a height making the upper surface thereof flush with the upper surface of the protrusion is formed around the protrusion of the underlayer, followed by preliminary formation of the poly-silicon layer covering the lower insulating layer and the upper surface of the protrusion of the underlayer. The isolation oxide film is then formed in the poly-silicon layer. Thereafter, the opening, or groove, for formation of the gate electrode is formed in the remaining poly-silicon region, followed by the formation of the gate electrode in the location of the groove.

Therefore, a high precision of registration of a mask for formation of the opening, or groove, for the gate electrode is required and the formation of the gate electrode cannot be done in self-alignment. However, the process for the production of the FET is naturally simplified. Furthermore, since the efficiency of vertical isolation can be increased by appropriately setting the height of the protrusion, the second process of the present invention can contribute to an increase in density of an integrated circuit.

According to the second process, the FET is of such a structure that the principal electrode regions have a junction with the upper surface of the protrusion, the area of which junction can be decreased to lower the junction capacitance.

In carrying out the second process of the present invention, it is preferable to use a nitride film as the thermal oxidation-proofing film.

In carrying out the second process, the ninth step is preferably conducted through a thermal oxidation treatment in the case where the underlayer is made of silicon. In this case, the gate insulating film and the upper insulating layer (occasionally, part of the upper insulating layer) can be formed simultaneously. The seventh step of ion implantation to decrease the electric resistance is preferably conducted between the sixth and eighth step or the eleventh and twelfth steps.

The third process for producing a FET of fifth structure according to the present invention comprises:

the first step of forming a dummy film pattern on the upper surface of an underlayer;

the second step of forming an $SiO_2$-containing film on the whole upper surface including the dummy film pattern according to a CVD method;

the third step of dry-etching the SiO$_2$-containing film to form an SiO$_2$-containing side wall around the dummy film pattern;

the fourth step of etching the underlayer using the dummy film pattern and the SiO$_2$-containing side wall as a mask to form a protrusion;

the fifth step of forming a preliminary SiO$_2$-containing film with a thickness making the upper surface thereof flush with the upper surface of the dummy film pattern on the underlayer by utilizing an SiO$_2$etching-back technology;

the sixth step of etching the preliminary SiO$_2$-containing film and the SiO$_2$-containing side wall down to a depth flush with the upper surface of the protrusion while using the dummy film pattern as a mask to form lower insulating layer constituted of the remaining preliminary SiO$_2$-containing film;

the seventh step of forming a poly-silicon layer with a height making the upper surface thereof flush with the upper surface of the dummy film pattern on the lower insulating layer and the exposed area of the upper surface of the protrusion by utilizing a poly-silicon etching-back technology;

the eighth step of forming a thermal oxidation-proofing film on an area of the poly-silicon layer which area covers the protrusion in the length-wise direction of a channel and wherein first and second principal electrode regions are to be formed;

the ninth step of thermally oxidizing the poly-silicon layer to form an isolation oxide film to constitute part of an upper insulating layer while at the same time defining the first and second principal electrode regions;

the tenth step of removing the thermal oxidation-proofing film;

the eleventh step of effecting ion implantation to decrease the electric resistance of the first and second principal electrode regions;

the twelfth step of removing the dummy film pattern to form a gate opening;

the thirteenth step of forming an insulating film constituting the other part of the upper insulating layer on the exposed surfaces of the first and second principal electrode regions and forming a gate insulating film on the upper surface of the protrusion;

the fourteenth step of forming a gate electrode on the gate insulating film;

the fifteenth step of forming contact holes through the upper insulating film; and the sixteenth step of forming first and second principal electrodes, via the contact holes, in contact with the first and second principal electrode regions, respectively.

This third process provides the same merits as described in connection with the embodiment of the first process for producing the FET of third structure and the embodiment of the second process for producing the FET of fourth structure. For example, the FET produced by the third process can be of such a structure that the principal electrode regions have a junction with parts of the side wall and upper surface of the protrusion of the underlayer, whereby the area of junction can be decreased to lower the junction capacitance while at the same time decreasing the electric resistance of the principal electrode regions. Furthermore, the gate electrode can be formed in self-alignment in the opening formed by removal of the dummy film pattern.

Also in this case, the local formation of the thermal oxidation-proofing film on the poly-silicon layer is followed by the local thermal oxidation of poly-silicon layer to form the isolation oxide film. The efficiency of vertical isolation can be increased by appropriately setting the height of the protrusion to allow an integrated circuit to be increased in density.

In carrying out the third process, it is preferable to use a nitride film as the thermal oxidation-proofing film.

In carrying out the third process, it is preferable that the thirteenth step be conducted through a thermal oxidation treatment in the case where the underlayer is made of silicon. In this case, the gate insulating film and the upper insulating layer (occasionally, part of the upper insulating layer) can be formed simultaneously.

The step of ion implantation to decrease the electric resistance of the principal electrode regions is preferably conducted between the tenth and twelfth steps or between the fifteenth and sixteenth steps.

In the foregoing process, it is preferable to use a nitride film pattern as the dummy film pattern.

According to the process of the present invention for producing a CMOS structure, formation of a well of one conductivity type in an underlayer of the other conductivity type is followed by forming of a field effect transistor with a channel of the one conductivity type by using the underlayer of the other conductivity type and a field effect transistor with a channel of the other conductivity type by using the well of the one conductivity type according to one of the foregoing processes for producing s field effect transistor.

This process for producing a CMOS structure can be endowed with the foregoing merits of the adopted process for producing a field effect transistor.

In the foregoing embodiments of the present invention, the underlayer is formed of silicon, a compound semiconductor material, or other suitable material to be endowed with an adequate conductivity. Therefore, when the channel is formed in the protrusion, no insulating layer exists down to the reverse surface of the underlayer on the lower side of the channel region. The underlayer may be formed of different materials, one of which is used for the protrusion of the underlayer, and the other of which is used for the other portion of the underlayer. Further, the underlayer may be constituted of either a substrate itself or a composite structure comprising a substrate and an epitaxially grown layer or other type layer formed thereon. The size of the protrusion may be suitably determined in accordance with designing.

BRIEF DESCRIPTION OF THE DRAWINGS

The foregoing and other objects, features and advantages of the present invention will be better understood from the following description taken in connection with the accompanying drawings, in which:

FIG. 1 is a cross-sectional view of a typical example of the structure of a conventional MOSFET;

FIG. 2 illustrates the field effect transistor of the present invention, and includes FIG. 2A which is a view of the principal part thereof, FIG. 2B which is a cross-sectional view taken along line I—I of FIG. 2A and illustrative of an example of the field effect transistor of first structure, and FIG. 2C which is a partial perspective view thereof including a cross-sectional view taken along line II—II of FIG. 2A;

FIG. 3 is a cross-sectional view similar to FIG. 2B and illustrative of an example of the field effect transistor of second structure according to the present invention;

FIG. 4 is a cross-sectional view similar to FIG. 2B and illustrative of an example of the field effect transistor of third structure according to the present invention;

FIG. 5 is a cross-sectional view similar to FIG. 2B and illustrative of an example of the field effect transistor of fourth structure according to the present invention;

FIG. 6 is a cross-sectional view similar to FIG. 2B and illustrative of an example of the field effect transistor of fifth structure according to the present invention;

FIGS. 7A to 7O and 8A to 8O are process diagrams illustrating a process for producing a field effect transistor of first structure according to the present invention, in which FIGS. 7A to 7O are cross-sectional views of structures formed in the respective steps of the process and corresponding to a cross-sectional view taken along line III—III of FIG. 2A and FIGS. 8A to 8O are cross-sectional views thereof corresponding to a cross-sectional view taken along line IV—IV of FIG. 2A;

FIGS. 9A to 9F are process diagrams illustrating a process for producing a field effect transistor of second structure according to the present invention, and are cross-sectional views of structures formed in the respective steps of the process and corresponding to a cross-sectional view taken along line III—III of FIG. 2A;

FIGS. 10A to 10L are process diagrams illustrating a process for producing a field effect transistor of third structure according to the present invention, and are cross-sectional views of structures formed in the respective steps of the process and corresponding to a cross-sectional view taken along line III—III of FIG. 2A;

FIGS. 11A to 11K are process diagrams illustrating a process for producing a field effect transistor of fourth structure according to the present invention, and are cross-sectional views of structures formed in the respective steps of the process and corresponding to a cross-sectional view taken along line III—III of FIG. 2A;

FIGS. 12A to 12F are process diagrams illustrating a process for producing a field effect transistor of fifth structure according to the present invention, and are cross-sectional views of structures formed in the respective steps of the process and corresponding to a cross-sectional view taken along line III—III of FIG. 2A;

FIGS. 13A to 13H are process diagrams illustrating a case of producing a CMOS structure using a process for producing a field effect transistor according to the present invention; and FIGS. 14A and 14B are diagrams illustrative of a process for producing an example of the first structure according to the present invention.

PREFERRED EMBODIMENTS OF THE INVENTION

Examples of FET structure of the present invention will now be described together with the processes for producing the same according to the present invention while referring to the accompanying drawings.

In the figures, the shapes and sizes of constituents as well as the positional relationships therebetween are drawn so schematically so as to merely facilitate the understanding of the present invention. The following examples are merely suitable cases, and hence should not be construed as limiting the scope of the present invention.

Description of FET Structure

First, examples of the FET structure of the present invention will be described while referring to FIGS. 2A to 2C as well as FIGS. 3 to 6. In the following description, mention of numerical conditions in particular is omitted. As for the numerical conditions, reference is to be made to description of the processes.

Example of First Structure

FIG. 2A is a plan view of the principal part of an example of the first structure, while FIGS. 2B and 2C are a cross-sectional view thereof taken along line I—I of FIG. 2A and a partial perspective view thereof including a cross-sectional view thereof taken along line II—II of FIG. 2A, respectively.

This example of FET is of such a structure at least comprising an underlayer 30, a lower insulating layer 36, first and second principal electrode regions 38 and 40, and upper insulating layer 42, a gate insulating film 44, a gate electrode 46, first and second principal electrodes 48 and 50. The underlayer 30 is constituted of a protrusion 32 and a flat portion 34 other than the protrusion. Here, the protrusion 32 is sometimes referred to as the "protrusion of the underlayer". In the present invention, the gate electrode 46 is provided on the upper surface of the protrusion 32 with the gate insulating film 44 therebetween in order to form a channel in the protrusion 32. In this example, therefore, the width of the protrusion 32 in the length-wise direction of the channel (channel length L=gate length) is substantially the same as the width of the gate electrode 46, while the length of the protrusion 32 in the width-wise direction of the channel (channel width: D) is substantially the same as the length of the gate electrode 46.

The underlayer 30, which will suffice as long as it has a suitable conductivity, may be in the form of a silicon substrate, a compound semiconductor substrate, or a suitable material chosen in accordance with designing. Further, the protrusion 32 and flat portion 34 of the underlayer 30 may be made of either the same material or respective different materials. For example, a silicon substrate with an epitaxially grown layer thereon is formed into the underlayer 30 constituted of the flat portion 34 formed of the silicon substrate and the protrusion 32 formed of the epitaxially grown layer. Where the protrusion 32 and the flat portion 34 are respectively made of different materials, a substrate potential can be applied to the underlayer 30 from the reverse surface thereof if desired. The cross-sectional shape of the protrusion 32 as viewed in FIG. 2B is preferably rectangular as shown in the figure, but may be in an arbitrary form such as a quadrate, a trapezoid or a reverse trapezoid in accordance with designing.

The lower insulating layer 36 is provided on the flat portion 34 of the underlayer 30 around the protrusion 32 in such a way as to substantially embed the protrusion 32. At least the portion of the lower insulating layer 36 in contact with the protrusion 32 will essentially suffice in so far as it is provided up to a suitable height along the protrusion 32. However, it is preferable that the lower insulating layer 36 range up to a height close to the upper end edge of the protrusion 32. In this example, the uppermost end of the lower insulating layer 36 in contact with the side wall of the protrusion 32 is located at a minute distance down from the upper end edge of the protrusion 32 and in parallel with the upper end edge of the protrusion 32. That minute distance in the height-wise direction of the protrusion 32, namely in the direction perpendicular to the width-wise direction of the channel, is the width of contact between the first and second principal electrode regions 38 and 40 and the underlayer 30. The portion of the lower insulating layer 36 other than the portion thereof in contact with the protrusion 32 is set to be smaller in thickness than the above-mentioned contact portion. The lower insulating layer 36 may be formed of PSG, BPSG, SiO$_2$ or other suitable material. In this example, it is formed of PSG or BPSG. The cross-sectional shape of the lower insulating layer 36 as viewed in FIG. 2B is such that the flat portion 34 thereof has a small thickness and a flat upper surface, but the thickness of the lower insulating layer 36 gradually and continuously increases from a certain point close to the protrusion 32 toward the side wall of the protrusion 32.

Next, a description will be made of the first and second principal electrode regions 38 and 40.

The first and second principal electrode regions 38 and 40 are source/drain regions in the form of conductive layers. Here, by way of example, the first principal electrode region 38 is a source conductive layer, while the second principal electrode region is a drain conductive layer. In the present invention, the principal electrode regions 38 and 40 are provided on the upper side of the lower insulating layer 36, and are arranged on the respective sides of the protrusion 32 of the underlayer 30 in the length-wise direction of the channel. Therefore, the principal electrode regions 38 and 40 are in electrical contact with the protrusion 32 along the width-wise direction of the channel, not along the length-wise direction of the channel. In this example, the principal electrode regions 38 and 40 each have a junction with the side wall of the upper end edge portion of the protrusion 32 on the upper side of the lower insulating layer 36. Here, the areas of junction of the principal electrode regions 38 and 40 with the protrusion 32, which areas occasionally include some proximate areas thereof, are referred to as "junctions" or "areas of junction(or contact)".

The width of the areas of junction along the height-wise direction of the protrusion 32 and hence the area of junctions are preferably so minimal that the contact resistance in these junctions exerts no adverse influences on the operational characteristics of the FET. The minimal area of the junctions can lead to a decrease in the junction capacitance.

The principal electrode regions 38 and 40 are electrically insulated from the underlayer 30 by the presence of the lower insulating layer 36 therebetween except that they have a junction with the underlayer only through the above-mentioned areas of junction. Therefore, the area of junction between the principal electrode regions 38 and 40 and the underlayer 30 and hence the junction capacitance are much smaller than those in the case of conventional FETs.

The layer thickness of the principal electrode regions 38 and 40 are larger in the respective areas thereof apart from the protrusion 32 than the above-mentioned areas of junction. In this example, since the upper surface of the principal electrode regions 38 and 40 formed on the lower insulating layer 36 are flush with the upper surface of the protrusion, the principal electrode regions 38 and 40 are thin in the area of junction thereof and thick in the areas thereof other than the areas of junctions, as described above. This enables the principal electrode regions 38 and 40 to be decreased in electric resistance.

The principal electrode regions 38 and 40 are formed as conductive layers made of poly-silicon as the base material and containing a suitable impurity, such as P (phosphorus) or B (boron), determining the conductivity type (N-type or P-type) thereof and incorporated thereinto to decrease the electric resistance thereof.

The extension of the principal electrode regions 38 and 40 in the width-wise direction of the channel is preferably the same as the gate width, while the extension thereof in the length-wise direction of the channel is preferably in the minimum range wherein the principal electrode regions 38 and 40 can at least secure contact with the source (first) and drain (second) electrodes 48 and 50, respectively. Additionally stated, the active area is substantially determined by the area of the principal electrode regions 38 and 40.

Next, a description will be made of the upper insulating layer 42. The upper insulating layer 42 substantially covers the whole upper surface on the upper side of the underlayer 30 except for the areas required to secure electrode contact with the principal electrode regions 38 and 40 and the upper surface of the protrusion 32, on the upper side of which the gate electrode 46 is provided. The upper insulating layer 42 is connected with the lower insulating layer 36 in such a way as to define the boundaries of the principal electrode regions 38 and 40 except for the junctions thereof with the protrusion 32. Therefore, the substantially whole boundaries of the principal electrode regions 38 and 40 except for the areas thereof necessary otherwise are substantially surrounded by the lower and upper insulating layer 36 and 42. In the figures, the portions of the upper insulating layer 42 defining the principal electrode regions 38 and 40 is designated by character 42a, while the other portion thereof is designated by character 42b.

The upper insulating layer 42 is preferably formed of silicon oxide obtained through thermal oxidation of poly-silicon effected when the principal electrode regions 38 and 40 are formed as will be described later. This provides a merit of simultaneous formation of the principal electrode regions 38 and 40 and the upper insulating layer 42 from the standpoint of production. Since the upper insulating layer 42 is connected with the lower insulating layer 36, the portions of the upper and lower insulating layers on the upper and lower sides of the connection as well as the connection (42a) exist on the flat portion 34 of the underlayer 30 to serve as the isolation region. While the upper insulating layer 42 is a silicon oxide film formed through the thermal oxidation of poly-silicon in this example, the upper insulating layer 42 may further comprise other suitable insulating layer(s) (not shown in the figures), such as an intermediate insulating layer, formed before and/or after that thermal oxidation.

The contact holes 52 and 54 are formed in the upper insulating layer 42. As usual, the principal electrodes 48 and 50 are provided in and over the contact holes 52 and 54, respectively. In the figures, only parts of the principal electrodes 48 and 50 are shown. The gate insulating film 44, for example, in the form of a gate oxide film is provided in the gate opening 56 (also called the "gate hole" of "gate groove") provided on the upper surface of the protrusion 32 and surrounded by the upper insulating layer 44 (42b). The gate electrode 46 is provided on the gate insulating film 44.

Examples of the second to fifth structures will now be described in sequence. Since these examples are basically the same as the example of the first structure, however, the following description will be made while bringing the differences thereof from the example of the first structure into focus. Accordingly, with respect to matters not particularly described hereinafter, reference is to be made to the description of the example of the first structure. While the shapes, sizes, etc. of constituents may be different from those in the example of the first structure, the same numeral used in the example of the first structure denotes a constituent mentioned under the same term in the examples in the following descriptions.

Examples of Second Structure

An example of the second structure of FET will be described while referring to FIG. 3.

In the structure of this example, the cross-sectional shape and used material, in particular, of a lower insulating layer 36 provided on an underlayer 30 are different from those in the example of the first structure. In the example, the lower insulating layer 36 is formed of an insulating materail such as $SiO_2$ rather than PSG or BPSG, which may, however, be used in this example as well. Therefore, the thickness of the lower insulating layer 36 is changed step-wise rather than gradually and continuously. More specifically, the thickness of the lower insulating layer 36 is large in a portion thereof in contact with a protrusion 32 and small in almost all the other flat portion 34 thereof with a flat upper surface. Correspondingly, principal electrode regions 38 and 40 are thick in the respective portions thereof formed on the flat portion 34 of the lower insulating layer 36 and thin in the respective portions thereof in contact with the protrusion 32.

Even in this case, the example of the second structure is substantially the same as the example of the first structure in many respects, as can be seen from the fact that the side wall of the upper end edge of the protrusion 32 of the underlayer 30 has a junction with the principal electrode regions 38 and 40, and that a gate electrode 46 is provided on the upper side of the protrusion 32 with agate insulating film 44 therebetween.

Example of Third Structure

An example of the third structure of FET will be described while referring to FIG. 4.

In this example, principal electrode regions 38 and 40 each have a junction with a protrusion 32 of an underlayer 30 in the corner area thereof, namely the side wall and upper surface thereof, and along the width-wise direction of a channel. In this example, therefore, an lower insulating layer 36 is formed in the same way as in the example of the second structure. However, the principal electrode regions 38 and 40 are provided in the upper side of the lower insulating layer 36 in such a way as to have respective slightly protruding portions thereof on the upper surface of the protrusion 32 in the length-wise direction of the channel. In this example as well, it is preferable that the total area of junction of the side wall and upper surface of the protrusion 32 with the principal electrode regions 38 and 40 be set to be so minimal as not to adversely affect the characteristics of the device like in the examples of the first and second structures.

In this case, the principal electrode regions 38 and 40 are formed in such a way as to have the upper surfaces thereof located higher than the upper surface of a gate insulating film 44 provided on the protrusion 32.

Since the principal electrode regions 38 and 40 are extending in the length-wise direction of the channel onto the upper surface of the protrusion 32 from the two sides of the upper end edge of the protrusion 32, the gate insulating film 44 have a width smaller in the length-wise direction of the channel than the upper surface of the protrusion 32, while it is provided all along the width of the channel in the width-wise direction thereof. The gate electrode 46 is provided on the gate insulating film 44 in such a way as to be electrically insulated from the principal electrode regions 38 and 40 with part (42b) of an upper insulating layer 42 therebetween.

Example of Fourth Structure

An example of the fourth structure of FET will be described while referring to FIG. 5.

The example of the fourth structure is characterized in that first and second principal electrode regions 38 and 40 each have a junction with the upper surface of a protrusion 32 of an underlayer 30, that a flat lower insulating layer 36 is formed on a flat portion 32 of the underlayer 30 up to a level flush with the upper surface of the protrusion 32 to just embed therein the protrusion 32, and that a portion 42a of an upper insulating layer 42 defining the principal electrode regions 38 and 40 is formed through thermal oxidation of a poly-silicon layer with a pattern of an oxidation-proofing film formed thereon.

In this case, the lower insulating layer 36 is suitably in the form of an insulating film made of $SiO_2$or other material like in the example of the second structure. Where isolation is sufficiently secured with the lower insulating layer 36, the height of the protrusion 32 of the underlayer 30 can be set even at such a level as to only enable securing a region wherein a channel is to be formed. The principal electrode regions 38 and 40 is located on the lower insulating layer 36 and on the upper side of the upper surface of the protrusion 32 without junction with the side wall of the protrusion 32.

The portion 42a of the upper insulating layer 42 defining the principal electrode regions 38 and 40 and joining with the lower insulating layer 36 is an isolation oxide film in the form of an $SiO_2$film formed through thermal oxidation of poly-silicon to form the principal electrode regions therefrom. The other portion of the upper insulating layer 42 may be in the form of either a film formed through thermal oxidation of poly-silicon or a suitable insulating film provided according to another method.

Example of Fifth Structure

An example of the fifth structure of FET will be described while referring to FIG. 6.

This example of the fifth structure is characterized in that junction between an underlayer 30 and first and second principal electrode regions 38 and 40 is effected through the side wall and upper surface of the protrusion 32 of the underlayer 30 like in the example of the third structure, and that a portion 42a of an upper insulating layer 42 defining the principal electrode regions 38 and 40 is formed through thermal oxidation of a poly-silicon layer with a pattern of an oxidation-proofing film formed thereon like in the example of the fourth structure.

Accordingly, a lower insulating layer 36 is in substantially the same form as in the examples of the second and third structures, while the principal electrode regions 38 and 40 provided on the lower insulating layer 36 each have a junction with the side wall and the upper surface of the upper end edge of the protrusion 32 all along the width of a channel in the width-wise direction thereof. The portion 42a of the upper insulating layer 42 defining the principal electrode regions 38 and 40 is formed of an SiO₂ film formed through thermal oxidation of poly-silicon in such a way as to join with the lower insulating layer 36, like in the example of the fourth structure. The other portion 42b of the upper insulating layer 42 is a film formed through thermal oxidation of poly-silicon, but may be another type of insulating film.

The variety of the FET of the present invention should not be construed as being restricted to the foregoing examples of the first to fifth structures. For example, the areas of junction between the underlayer and the first and second principal electrode regions are not limited to the proximity of the upper end edge of the protrusion, but may be anywhere along the side wall of the protrusion. While no intermediate insulating layer is drawn in the foregoing figures only for convenience of simple drawing, those structures are preferably provided with an intermediate insulating layer.

Description of Processes for Producing EFT

In the following examples, a description will be made of a case where an N-channel type FET is produced using a p-type silicon substrate as an underlayer. An example of the process for producing the example of the first structure will first be described, followed by the description of examples of the processes for producing the examples of the second to fifth structures, wherein differences thereof from the process for producing the example of the first structure will be mainly mentioned. Additionally stated, the same numerals or characters denote constituents functionally in common with one another in the figures to which reference will be made, even if the constituents may be different from each other in shape and formation method.

Example of Process for producing First Structure

A description will be made of an example of the process for producing the first structure of FET while referring to FIGS. 7A to 7O which are cross-sectional views corresponding to the cross section taken along line III—III of FIG. 2A as well as to FIGS. 8A to 8O which are cross-sectional views corresponding to the section taken along line IV—IV of FIG. 2A.

In the first step of the process, a dummy film pattern 62 is formed on the upper surface of an underlayer 30 (see FIG. 7B and FIG. 8B). This is done, for example, using the following procedure.

The whole upper surface of a p-type Si substrate 30 as the underlayer is coated with an insulating film, such as a nitride film 60, having a suitable thickness of, for example, about 0.2 μm according to a suitable method (see FIG. 7A and FIG. 8A).

Subsequently, the nitride film 60 is etched according to a photorithographic etching technology to form a dummy film pattern 62 (see FIG. 7B and FIG. 8B). The dummy film pattern 62 substantially determines the gate length and gate width of the first structure.

In the subsequent second step, a portion of the substrate 30 which is not covered with the dummy film pattern 62 is etched from the upper surface of the substrate down to a suitable depth of, for example, about 0.6 μm in accordance with designing to form a flat portion 34 of the underlayer. The portion of the substrate 30 not etched away remains as a portion 32 of the underlayer (see FIG. 7B and FIG. 8B). A channel is to be formed somewhere in the protrusion 32 when the FET is operated.

In the subsequent third step, a lower insulating layer 36 in contact with the side wall of the protrusion 32 is formed (see FIG. 7E and FIG. 8E). This is done, for example, using the following procedure.

The whole upper surface of the structure obtained in the second step is coated with an insulating material capable of thermal flow by a suitable method to form a preliminary insulating film 64 (see FIG. 7C and FIG. 8C). In this example, the insulating material is preferably PSG, BPSG, or the like material. In the case of PSG, the P₂O₅ content thereof is preferably about 8 mol % and the thickness of the preliminary insulating film 64 is preferably about 0.4 μm. Subsequently, the PSG film 64 is flowed into an adequate shape by heating particularly in such a way as to adjust the thickness thereof just on the upper side of the protrusion 32 to a value just in accordance with designing. At this time of thermal flow, the heating temperature and time are set to be, for example, about 1,000 C and about 30 minutes.

In FIG. 7D and FIG. 8D, numeral 66 denotes the shaped PSG film. The cross-sectional profile of the shaped PSG film 66 is such that it changes continuously and gradually from the area thereof on top of the protrusion 32 toward the areas thereof on the flat portion 34 to become flat from some places on the flat portion 34.

Subsequently, the shaped PSG film 66 is subjected to such wet etching as to leave a intact a part thereof, which is to serve as the lower insulating layer 36 (see FIG. 7E and FIG. 8E). The wet etching of the shaped PSG film 66 is effected to such an extent that an upper surface portion thereof is removed in the same thickness all across the whole area thereof. Therefore, as shown in FIG. 7E and FIG. 8E, the cross-sectional profile of the lower insulating layer 36 is such that the thickness of the lower insulating layer 36, which is maximum in the places thereof in contact with the protrusion 32, gradually decreases with an increase in distance from the protrusion 32 to become uniform from some places on the flat portion 34 a little apart from the protrusion 32.

The term "shaped" as used herein is intended to mean that a PSG or BPSG film formed in substantially the same thickness on both of the dummy film pattern 62 and the flat portion 34 of the underlayer is flowed by heating to provide an adequate difference in thickness between the area thereof on the dummy film pattern 62 and the area thereof on the flat portion 34.

When the thickness of the PSG film on the dummy film pattern 62 is reduced by thermal flow as shown in FIG. 14, the subsequent uniform wet etching of the PSG film results in reflection of the profile thereof before the wet etching to expose the upper area of side wall of the protrusion as desired while leaving intact some of the PSG film on the flat portion 34 as shown in FIG. 14B.

Accordingly, the "shaping" of the PSG film is to adjust the profile of the PSG film with the aim of securing a finally desired exposed area of the side wall of the protrusion as well as a desired thickness on the flat portion 34 of the finally remaining PSG film by controlling the coating film thickness of PSG, the thermal flow conditions and the wet etching conditions.

In this example, the thickness of the planar portion of the lower insulating layer 36 on the flat portion 34 is preferably about 0.3 μm. The distance between the upper end edge of the protrusion 32 and the uppermost end of the lower insulating layer 36 along the side wall of the protrusion 32 (height of the exposed area of the side wall of the protrusion 32), which should be set suitable in accordance with designing, is determined by the thickness of the shaped PSG film 66 just on the upper side of the upper surface of the protrusion 32 and the amount of wet etching. This distance is preferably such that the final corresponding distance after a heat treatment which will be conducted in a later step can be, for example, about 0.05 μm. This can be accomplished by appropriately setting the thickness of the original PSG film 64, the thermal flow conditions and the amount of wet etching in the third step. Since the lower insulating layer 36 is a layer provided with the aim of decreasing the junction capacitance between the underlayer and first and second principal electrode regions (in other words, source/drain conductive layers) to be formed in a later step by decreasing the area of direct contact therebetween, the thickness of the lower insulating layer 36 may be set reasonably. Additionally stated, the principal electrode regions, which are to serve as the source/drain conductive layers when a device or element is completed, are called so for convenience of explanation even when they are yet to reach the stage of those conductive layers.

In the subsequent fourth step, a poly-silicon layer 70 is formed on the lower insulating layer 36 up to a height flush with the upper surface of the dummy film pattern 62 (see FIG. 7F and FIG. 8F). This is done, for example, using the following procedure.

A preliminary poly-silicon film 68 (indicated by the broken lines in FIG. 7F and FIG. 8F) is first formed on the whole upper surface of the structure obtained in the third step and as shown in FIG. 7E and FIG. 8E. The upper surface of the preliminary poly-silicon film 68 is made planar. Alternatively a planar surface is provided using a resist material equal in etching rate to poly-silicon, the resist material being provided on an initially formed poly-silicon film.

Subsequently, the preliminary poly-silicon film 68 is etched back using the dummy film pattern 62 as an etching stopper to make the upper surface thereof flush with the upper surface of the dummy film pattern 62, whereby the above-mentioned poly-silicon layer 70 is formed (see FIG. 7F and FIG. 8F). This poly-silicon layer 70 is in contact with the aforementioned exposed area of the side wall of the protrusion 32.

In the subsequent fifth step, the poly-silicon layer 70 is subjected to partial thermal oxidation to form the first and second principal electrode regions 38 and 40 and a silicon oxide film (42a and 42b) constituting the upper insulating layer 42 (see FIG. 7H and FIG. 8H). This is done, for example, using the following procedure.

The area of the poly-silicon layer 70 other than the areas thereof where the principal electrode regions 38 and 40 are to be formed is removed down to a predetermined depth in the thickness-wise direction of the layer 70 by etching to preliminarily define the first principal electrode region 38 on one side in the length-wise direction of a channel and the second principal electrode region 40 on the other side in the length-wise direction of the channel (see FIG. 7G and FIG. 8G). More specifically, poly-silicon extending in the length-wise direction of the channel beyond a predetermined distance from the protrusion 32 is partially removed by etching (see FIG. 7G), while at the same time poly-silicon extending in the width-wise direction of the channel on the outside of the protrusion 32 beyond the two ends thereof as the boundaries therebetween are partially removed by etching (see FIG. 8G). The etching depth is uniform across the area where the poly-silicon layer 70 is etched.

This etching operation forms the preliminary boundaries of the principal electrode regions. The thickness of the remaining poly-silicon layer in the area thereof reduced in thickness by the etching is set at such a level so that an oxide film to be formed through later heat treatment of the poly-silicon layer later can reach the lower insulating layer 36. In this example, the etching depth for formation of the preliminary boundaries is, for example, about 0.3 μm.

Subsequently, the poly-silicon layer 70 remaining after the etching operation is subjected to a thermal oxidation treatment to simultaneously form the upper insulating layer 42 and the principal electrode regions 38 and 40 (see FIG. 7H and FIG. 8H). The areas of poly-silicon remaining unoxidized after the thermal oxidation treatment constitute the principal electrode regions 38 and 40, while a silicon oxide film formed through oxidation of poly-silicon constitutes the upper insulating layer 42. Part of the upper insulating layer 42 surrounding the principal electrode regions 38 and 40 joining with the lower insulating layer 36 to act as an isolation region is designated by character 42a, while the other part of the upper insulating layer 42, e.g., part of the silicon oxide film on the upper side of the principal electrode regions 38 and 40, is designated by character 42b. The latter part 42b of the silicon oxide film can also serve as an insulating film between the principal electrode regions 38 and 40 and a gate electrode to be formed in a later step. The thermal oxidation of poly-silicon is preferably effected in such a way as to make the upper surface of the principal electrode regions 38 and 40 substantially flush with the upper surface of the protrusion 32.

In the subsequent sixth step, the dummy film pattern is removed by a suitable method (see FIG. 7I and FIG. 8I). In this example, this may be done, for example, through selective wet removal with heated H₃PO₄ (hot phosphoric acid). The whole area of the upper surface of the protrusion 32 is exposed by this removal of the dummy film pattern to form a gate groove 56 (opening or hole) surrounded by the upper insulating layer 42b.

In the subsequent seventh step, a gate insulating film 44 is formed on the upper surface of the protrusion 32 (see FIG. 7J and FIG. 8J). This gate insulating film 44 can be formed by a suitable method. In this example, silicon in the protrusion 32 of the underlayer 30 is thermally oxidized to form a silicon oxide film as the gate insulating film 44 The thickness of the gate insulating film 44 is preferably about 200 Å.

In the subsequent eighth step, a gate electrode 46 is formed on the gate insulating film 44 (see FIG. 7M and FIG. 8M). Since the gate electrode 46 is formed in the gate groove 56 formed through the removal of the dummy film pattern, the gate electrode 46 is formed in self-alignment with the protrusion 32. The material of the gate electrode 46 may be low-resistance poly-silicon doped with a high concentration of phosphorous. The formation of the gate electrode 46 is done, for example, using the following procedure.

A poly-silicon layer 72 of about 0.3 μm in thickness is first deposited on the whole upper surface of the structure obtained in the seventh step (see FIG. 7K and FIG. 8K).

Subsequently, in this example, an impurity such as phosphorus (P) is implanted into the poly-silicon layer 72, followed by thermal diffusion thereof. Thus, polysilicon layer 72 is turned into an N-type conductive layer having a high phosphorus concentration (see FIG. 7L and FIG. 8L).

Thereafter, the N-type conductive layer is subjected to patterning using a photolithographic etching technology to form the gate electrode 46 (see FIG. 7M and FIG. 8M).

In the subsequent ninth step, an intermediate insulating layer 74 constituting part of the upper insulating layer 42 is formed in the same manner as in a conventional process for producing a FET. This intermediate insulating layer 74, which may be provided if necessary, is formed, for example, by preliminary deposition of PSG and subsequent thermal flow thereof. Thereafter, contact holes 52, 54 and 78 are formed through predetermined locations of the upper insulating layer 42 (see FIG. 7N and FIG. 8N). After the formation of the contact holes, an impurity such as phosphorus (P) or arsenic (As) is ion-implanted into the first and second principal electrode regions 38 and 40 to turn them into N-type conductive layers. The dose of ions implanted is preferably $10^{16}/cm^2$. The ion implantation is followed by a thermal diffusion treatment of the implanted ions. In this case, since the principal electrode regions 38 and 40 are formed of poly-silicon, the diffusion of phosphorus (P), arsenic (As) or the like is faster inside the principal electrode regions than inside single crystal silicon. This enables the impurity implanted via the contact holes to be easily diffused all across the principal electrode regions.

In the subsequent tenth step, first and second principal electrodes 48 and 50, via the contact holes 52 and 54, in contact with the first and second principal electrode regions 38 and 40, respectively, are formed in the same manner as in a conventional process for producing a FET (see FIG. 7O and FIG. 8O). Thereafter, necessary interconnections for the respective electrodes are formed.

According to the foregoing process for producing the first structure of FET, the isolation region can be formed simultaneously with the principal electrode regions. Furthermore, since the gate electrode is formed in the gate groove formed through removal of the dummy film pattern initially formed, the formation of the gate electrode can be effected in self-alignment. Moreover, the area of junction between the underlayer and the principal electrode regions can be made small, while at the same time the principal electrode regions can be formed in large thickness in the areas thereof other than the areas of junction.

The foregoing example is merely a preferred one, and hence should not be construed as limiting the scope of the present invention. For example, while the production of the N-type channel FET has been described in the foregoing example, a P-type channel FET may be produced in a similar manner. In the latter case, an N-type substrate may be used, or formation of an N-type well in a P-type substrate is followed by production of a P-type channel FET in the well. While the N-type conductive layers are formed in the foregoing example, P-type conductive layers may alternatively be formed through ion implantation of boron (B) or boron fluoride ($BF_2$) and subsequent thermal diffusion of the implanted ions in the ninth step.

Example of producing Second Structure

An example of the process for producing the second structure of FET according to the present invention will be described while referring to FIGS. 9A to 9F.

This example of the process is different in the third and fourth steps from the example of the process for producing the first structure of FET (hereinafter referred to in brief as the "first process") already described, while the other steps are substantially the same between the two processes. Accordingly, the third and fourth steps will be described in detail.

In this example, a lower insulating layer 36 is formed of an insulating material such as $SiO_2$, while junctions between a protrusion 32 of an underlayer 30 and principal electrode regions 38 and 40 are formed of a poly-silicon side wall.

Accordingly, the third step of the first process is replaced with the following procedure in this example of the process.

In this example, a first preliminary $SiO_2$ film 82 is deposited on the whole upper surface of the structure obtained in the second step of the first process (shown in FIG. 7B and FIG. 8B) according to a CVD method in such a way as to have a planar upper surface (indicated by the broken line in FIG. 9A). In this case, the planar upper surface may alternatively be secured using a resist material equal in etching rate to $SiO_2$ if the planar upper surface cannot be secured only with the first preliminary $SiO_2$ film 80.

Subsequently, the first preliminary $SiO_2$ film 80 is etched away using the dummy film pattern 62 formed of the nitride film as an etching stopper and utilizing an $SiO_2$ etching-back technology to such an extent as to make the upper surface thereof flush with the upper surface of the dummy film pattern 62, whereby a second preliminary $SiO_2$ film 84 is formed (See FIG. 9A).

Subsequently, the second preliminary $SiO_2$ film 84 is subjected to anisotropic etching (dry etching) from the upper surface thereof down to a depth midway along the protrusion 32 in the height-wise direction thereof, preferably down to a depth about 0.05 $\mu m$ apart from the upper surface of the protrusion 32, to form a third preliminary $SiO_2$ film 86. This anisotropic etching entails exposure of the peripheral side wall of the dummy film pattern 62 and part of the peripheral side wall of the protrusion 32 on the upper end edge thereof (see FIG. 9B).

Subsequently, the poly-silicon side wall 90 is formed around the peripheral side wall of the dummy film pattern 62 and the part of the peripheral side wall of the protrusion 32 on the upper end edge thereof by utilizing a poly-silicon anisotropic etching technology. This is done, for example, using the following procedure. Poly-silicon of, for example, about 0.4 $\mu m$ in thickness is deposited on the whole upper surface of the structure of FIG. 9B to form a preliminary poly-silicon film 88 having a uniform thickness (indicated by the broken line in FIG. 9C). Thereafter, the preliminary poly-silicon film 88 is subjected to anisotropic etching down to the upper surface of the third preliminary $SiO_2$ film 86, whereby the upper surface of the dummy film pattern 62 is exposed again while the above-mentioned poly-silicon side wall 90 remains (see FIG. 9C).

The third preliminary $SiO_2$ film 86 is further subjected to anisotropic etching with the poly-silicon side wall 90 and the dummy film pattern 62 being used as a mask to form a lower insulating layer 36 constituted of the remaining SiO₂ (see FIG. 9D). In this case, the etching depth, which may be arbitrarily in accordance with designing to allow the principal electrode regions formed later to be large in thickness, is, for example, about 0.3 μm. According to the foregoing procedure, the thickness of the lower insulating layer 36 made of SiO₂ is large in the area thereof just under the lower end of the poly-silicon side wall 90, but uniformly small in other area thereof.

According to this example of the process, the fourth step of the first process is replaced with the following procedure.

In this example, poly-silicon is deposited on the whole upper surface of the structure obtained in the third step (shown in FIG. 9D) to form a preliminary poly-silicon film 92 having a planar upper surface (indicated by the broken line in FIG. 9E), which is then etched back to form a poly-silicon film 94 having an upper surface flush with the upper surface of the dummy film pattern 62. The above-mentioned planar upper surface, if not secured, of the preliminary poly-silicon film 92 may alternatively be secured additionally using a resist material equal in etching rate to poly-silicon.

Thus, the poly-silicon film 94 is integrated with the poly-silicon side wall 90 to constitute a poly-silicon layer 70 similar to that shown in FIGS. 7F and 8F (see FIG. 9E).

The subsequent steps are conducted in sequence in the same manner as in the fifth and subsequent steps of the first process (shown in FIGS. 7G to 7O and FIGS. 8G to 8O) to finally obtain the FET structure as shown in FIG. 9F, though the cross-sectional profiles of the lower insulating layer 36 and the poly-silicon layer 70 as shown in the figures are different from those in the case of the first process.

According to the foregoing example of the process for producing the second structure, the junctions of the principal electrode region 38 and 40 with the protrusion 32 of the underlayer can advantageously be formed with further certainty in accordance with designing in addition to the same merits as those of the first process.

Example of Process for Producing the Third Structure

An example of the process for producing the third structure of FET according to the present invention (hereinafter sometimes referred to as the "third process") will be described while referring to FIGS. 10A to 10L.

In this example, an lower insulating layer 36 is formed of an insulating material such as SiO₂, while junctions between a protrusion 32 of an underlayer 30 and principal electrode regions 38 and 40 are formed of a poly-silicon side wall in such a way as to form a FET structure wherein the principal electrode regions 38 and 40 are in contact with an upper end edge corner area of the protrusion 32 of the underlayer 30, which are includes parts of the side wall and upper surface of the protrusion 32.

This example of the process has different second, third and fourth steps from the first process already described, while the other steps are substantially the same between the two processes. Accordingly, the different steps will be mainly described in detail.

In the first step of this example, a dummy film pattern 62 in the form of a nitride film is formed on a P-type silicon substrate 30 as an underlayer as shown in FIG. 10A, like in the first process. In this example, the second step of the first process is replaced with the following procedure.

An SiO₂ film 100 having a uniform thickness of about 1,000 Å is first formed on the whole upper surface of the substrate 30 with the nitride film 62 formed thereon according to a CVD method (see FIG. 10B).

The SiO₂ film 100 is then subjected to anisotropic etching to form an SiO₂ side wall 102 around the peripheral side wall of the dummy film pattern 62 (see FIG. 10C). The width of the SiO₂ side wall 102 on a level with the upper surface of the substrate 10 is about 1,000 Å.

Subsequently, the substrate 30 as the underlayer is etched away down to a predetermined depth while using the SiO₂ side wall 102 and the dummy film pattern 62 as an etching mask to form the protrusion 32 of the underlayer and a flat portion 34 of the underlayer (see FIG. 10D). In this case, the etching depth is about 0.6 μm.

In this example, the third step of the first process is replaced with the following procedure.

A first preliminary SiO₂ film 82 is first deposited on the whole upper surface of the structure obtained in the foregoing second step (shown in FIG. 10D) according to a CVD method, like in the already-described example of the process for producing the second structure (see FIG. 9A), in such a way as to have a planar upper surface (indicated by the broken line in FIG. 10E). When the planar upper surface of the first preliminary SiO₂ film 82 cannot be secured, a planar upper surface may alternatively be formed additionally using a resist material equal in etching rate to SiO₂.

Subsequently, the first preliminary SiO₂ film 82 is etched away down to a depth flush with the upper surface of the dummy film pattern 62 while using the dummy film pattern 62 in the form of the nitride film as an etching stopper and utilizing an SiO₂ etching-back technology to form a second preliminary SiO₂ film 84 constituted of the remaining SiO₂ (see FIG. 10E).

The second preliminary SiO₂ film is then subjected to anisotropic etching (dry etching) from the upper surface thereof down to a depth midway along the protrusion 32 in the height-wise direction thereof to form a third preliminary SiO₂ film 86 constituted of the remaining SiO₂. This etching entails simultaneous etching of the SiO₂ side wall 102 exposing not only part of the upper surface of the protrusion 32 but also the peripheral side wall of the dummy film pattern 62 located on the upper end edge of the protrusion 32 (see FIG. 10F). In this case, the width of the exposed area of the upper surface of the protrusion 32, ranging from the upper end edge thereof to the peripheral side wall of the nitride film 62 is about 1,000 Å.

Subsequently, a poly-silicon side wall 90 is formed around the peripheral side wall of the nitride film 62 and the exposed area of the protrusion 32 by utilizing a poly-silicon anisotropic etching technology (see FIG. 10G). This is done, for example, using the following procedure.

Poly-silicon is deposited on the whole upper surface of the structure of FIG. 10F to form a preliminary poly-silicon film 88 having a uniform thickness of, for example, about 0.4 μm (indicated by the broken line in FIG. 10G). Thereafter, the preliminary poly-silicon film 88 is subjected to anisotropic etching down to a depth flush with the upper surface of the third preliminary SiO₂ film 86, whereby the upper surface of the dummy film pattern 62 is exposed again while the above-mentioned poly-silicon side wall 90 remains (see FIG. 10G).

Subsequently, the third preliminary SiO$_2$ film 86 constituted of the remaining SiO$_2$ is further subjected to anisotropic etching with the poly-silicon side wall 90 and the dummy film pattern 62 being used as a mask to form a lower insulating layer 36 constituted of the remaining SiO$_2$ (see FIG. 10H). In this case, the etching depth, which may be arbitrarily set in accordance with designing in such a way as to allow the principal electrode regions 38 and 40 formed later to be large in thickness, is for example, about 0.3 μm. According to the foregoing procedure, the thickness of the lower insulating layer 36 made of SiO$_2$ is large in the area thereof just under the lowermost end of the poly-silicon side wall 90, and uniformly small in the other area thereof.

According to this example of the process, the fourth step of the first process is replaced with the following procedure.

In this example, poly-silicon is deposited on the whole upper surface of the structure obtained in the foregoing third step (shown in FIG. 10H) to form a preliminary poly-silicon film 92 having a planar upper surface (indicated by the broken line in FIG. 10I), which is then etched back to form a poly-silicon film 94 having an upper surface flush with the upper surface of the dummy film pattern 62. The above-mentioned planar upper surface, if not secured, of the preliminary poly-silicon film 92 may alternatively be secured additionally using a resist material equal in etching rate to poly-silicon.

Thus, the poly-silicon film 94 is integrated with the poly-silicon side wall 90 in this example as well to constitute a poly-silicon layer 70 similar to that shown in FIGS. 7F and 8F (see FIG. 10I).

The subsequent steps may be conducted in sequence in substantially the same manner as in the fifth and subsequent steps of the first process (shown in FIGS. 7G to 7O and FIGS. 8G to 8O), though the cross-sectional profiles of the lower insulating layer 36 and the poly-silicon layer 70 as shown in the figures are different from those in the case of the first process.

In the case of the third process, however, the fifth step of thermally oxidizing the poly-silicon layer 70 to form the principal electrode regions 38 and 40 and a thermally oxidized film (42a and 42b) constituting an upper insulating layer 42 must be carried out in such a way as to allow parts of the principal electrode regions 38 and 40 (part of the poly-silicon side wall 90 integrated into the poly-silicon layer 70) to still remain in the form of poly-silicon on the upper surface of the protrusion 32. In this example, therefore, the poly-silicon layer 70 is thermally oxidized preferably to such an extent as to allow about 500 Å-thick poly-silicon to remain on the upper surface of the protrusion 32. The principal electrode regions 38 and 40 each have a junction with parts of the side wall and upper surface of the protrusion 32 (see FIG. 10J).

Further, when the dummy film pattern 62 is removed in the sixth step in this example, the resulting gate groove 56 on the upper surface of the protrusion 32 has the principal electrode regions 38 and 40 partially exposed (see FIG. 10K). This entails a necessity of the exposed areas of the principal electrode regions 38 and 40 being covered with an insulating film. In this example, the seventh step of forming a gate insulating film is carried out through thermal oxidation of silicon constituting part of the above-mentioned protrusion 32 of the underlayer as well as poly-silicon constituting parts of the above-mentioned principal electrode regions (see FIG. 10K). Part of the resulting insulating film serves as the gate insulating film 44, while the other part thereof is integrated into part 42b of the upper insulating layer 42.

Thereafter, the same procedure as in the subsequent steps of the first process is followed to finally obtain in the FET structure as shown in FIG. 10L.

According to the foregoing example of the process for producing the third structure, the junctions of the principal electrode regions 38 and 40 with the protrusion 32 of the underlayer can advantageously be formed with further certainty in accordance with designing in addition to the same merits as those of the first process, while at the same time the protrusion margin is increased to facilitate the protrusion of this type of FETs since the principal electrode regions 38 and 40 each have a junction with both the side wall and upper surface of the protrusion 32.

Example of Process for Producing Fourth Structure

An example of the process for producing the fourth structure of FET according to the present invention (hereinafter sometimes referred to as the "fourth process") will be described while referring to FIGS. 11A to 11K.

In the first step, a p-type Si substrate 30 as an underlayer is processed using a photolithographic technology to form a protrusion 32 for a channel region and a flat portion 34 (see FIG. 11A). The height of the protrusion 32 from the upper surface of the flat portion 34, which may be arbitrarily set according to desired characteristics of the device, is about 3,000 Å in this example.

In the subsequent second step, an SiO$_2$ film is formed as a lower insulating layer 36 on the flat portion 34 of the underlayer in such a way as to just embed therein the protrusion 32 (see FIG. 11B). This is done, for example, using the following procedure. SiO$_2$ is first deposited on the whole upper surface of the structure obtained in the first step according to a CVD method to form a preliminary SiO$_2$ film 110 having a planar upper surface (indicated by the broken line in FIG. 11B). Alternatively, a planar upper surface may be formed additionally using a resist material equal in etching rate to SiO$_2$. The preliminary SiO$_2$ film 110 is then etched back using the upper surface of the protrusion 32 as an etching stopper to form the lower insulating layer 36 in the form of an SiO$_2$ film having an upper surface flush with the upper surface of the protrusion 32 (see FIG. 11B). The lower insulating layer 36 is, of course, in contact with the peripheral side wall of the protrusion 32, and uniform in thickness.

In the subsequent third step, a poly-silicon layer 112 having a planar upper surface is formed on the whole upper surface of the structure obtained in the foregoing second step according to a CVD method (see FIG. 11C). The thickness of the poly-silicon layer 112, which may be arbitrarily set in accordance with designing, is about 3,500 Å in this example.

In the subsequent fourth step, a pattern of a thermal oxidation-proofing film 114 is formed on the poly-silicon layer 112 according to a suitable method (see FIG. 11D). The thermal oxidation-proofing film 114 is preferably in the form of a nitride film. In this example, the nitride film of about 1,500 Å in thickness is deposited on the whole upper surface of the poly-silicon layer 112 according to a CVD method, and then subjected to patterning according to a photolithographic etching technology to form the nitride film pattern 114. In this example, the nitride film pattern 114 is formed on the areas of the poly-silicon layer 112, wherein first and second principal electrode regions are to be formed later, in such a way as to extend over the protrusion 32 in the length-wise direction of the channel (see FIG. 11D). Accordingly, the nitride film pattern 114 is in the form in plan of a strip with one length equal to that of the protrusion 32 in the width-wise direction of the channel and the other length substantially equal to a distance ranging from the outermost end of the first principal electrode region to the outermost end of the second principal electrode region.

In the subsequent fifth step, the poly-silicon layer 112 with the thermal oxidation-proofing nitride film pattern 11 thereon is subjected to thermal oxidation at a suitable temperature for a suitable period of time. Part 42a (isolation oxide film) of an upper insulating layer 42 is formed through this thermal oxidation of poly-silicon (see FIG. 11E). The isolation oxide film 42a joins with the lower insulating layer 36 to define a poly-silicon region 116 wherein the first and second principal electrode regions are to be formed later.

In the subsequent sixth step, the nitride film pattern 114 is removed to expose the poly-silicon region 116 (see FIG. 11E).

In the subsequent seventh step, ion implantation is effected to decrease the electric resistance of the poly-silicon region 116 (see FIG. 11F). Since this example is a case where an N-type channel FET is formed, an impurity such as phosphorus (P) or arsenic (As) is ion-implanted. Additionally stated, where a P-type channel FET is formed, the use of an impurity such as boron (B) or boron fluoride (BF$_2$) will suffice In this example, the concentration of phosphorus or arsenic to be ion-implanted is preferable around $10^{16}/cm^2$.

In the subsequent eighth step, the ion-implanted poly-silicon region 116 is dichotomized into the separate first and second principal electrode regions 38 and 40 (see FIG. 11G). This is done, for example, using the following procedure. A gate opening (groove) 56 is formed in the area of the poly-silicon region 116 located just on the upper side of the protrusion 32 according to a photolithographic etching technology. The gate opening 56, which has a length equal to the channel width and a width smaller than the channel length, is formed on the central area, in the length-wise direction of the channel, of the upper surface of the protrusion 32 in such a way as to cross, or traverse, the poly-silicon region 116 (see FIG. 11G). Therefore, the first and second principal electrode regions 38 and 40 remain in a state of the lower surfaces of the innermost end portions thereof in the length-wise direction of the channel being in contact with the respective end areas of the upper surface of the protrusion 32 all along those respective end areas in the width-wise direction of the channel, while the lower surfaces of the other portions of the principal electrode regions 38 and 40 are completely in contact with the lower insulating layer 36 and the peripheries of the principal electrode regions 38 and 40 other than the upper surfaces thereof and the protrusion 32 are surrounded by the isolation oxide film 42a (see FIG. 11D).

In the subsequent ninth step, an insulating film 42b constituting part of the upper insulating layer 42 is formed in the exposed areas of the first and second principal electrode regions 38 and 40, while at the same time a gate insulating film 44 is formed in the exposed area of the upper surface of the protrusion 32 with the gate groove 56 located thereon (see FIG. 11H). This is done by heat-treating the structure obtained in the eighth step to thermally oxidize an exposed surface portion of the poly-silicon regions constituting the principal electrode regions 38 and 40 into the silicon oxide film 42b and simultaneously thermally oxidize an exposed upper surface portion of the protrusion 32 into the silicon oxide film 44 as the gate insulating film (see FIG. 11H). The silicon oxide films 44 and 42b are integrated with each other. The silicon oxide film 42b, which constitutes part of the upper insulating layer 42, joins with and is integrated with the isolation oxide film 42a. The thickness of the silicon oxide film 42b is preferably about 500 Å on the upper side of the principal electrode regions 38 and 40, while the thickness of the gate insulating film 44 is preferably about 200 Å. Further, through the above-mentioned heat treatment for oxidation, ions implanted in the seventh step simultaneously undergo thermal diffusion to activate the principal electrode regions 38 and 40.

In the subsequent tenth step, a gate electrode 46, which is in contact with the silicon oxide films 42b and 44 formed in the gate groove 56 in this case, is formed in substantially the same manner as in the already-described eighth step of the first process (see FIG. 7K and FIG. 8K, as well as FIG. 11I). This is done, for example, using the following procedure. A poly-silicon layer 72 is first formed on the whole upper surface of the structure obtained in the ninth step according to a CVD method, followed by ion implantation of phosphorus (P) into the poly-silicon layer 72. Thereafter, phosphorus ions implanted into the poly-silicon layer 72 are subjected to thermal diffusion to turn the layer 72 into a high-concentration N-type conductive layer (see FIG. 7L and FIG. 8L), which is then subjected to gate patterning in the same manner as in the eighth step of the first process to form the gate electrode 46 (see FIG. 11J).

The subsequent steps of the fourth process, such as formation of contact holes (the eleventh step), formation of first and second principal electrode (twelfth step), formation of an intermediate insulating film and formation of interconnections, can be carried out in substantially the same manner as in the first process already described (see FIGS. 7M to 7O and FIGS. 8M to 8O). Finally, the fourth structure of FET as shown in FIG. 11L is obtained.

As is apparent from the above, the foregoing fourth process is different from the first process particularly in that the formation of the gate electrode is not effected in self-alignment, and that the principal electrode regions are defined by the oxide film obtained through local thermal oxidation of the poly-silicon layer with the pattern of the oxidation-proofing film formed thereon. The area of junction between the underlayer and the principal electrode regions can advantageously be decreased, while the thick principal electrode regions can advantageously be formed to decrease the electric resistance thereof.

Example of Process for Producing Fifth Structure

An example of the process for producing the fifth structure of FET according to the present invention (hereinafter sometimes referred to as the "fifth process") will be described while referring to FIGS. 12A to 12F.

In this example of the process, a lower insulating layer is formed of $SiO_2$, principal electrode regions are each made to have a junction with the side wall and upper surface of an upper end edge area of a protrusion of an underlayer, and part of an upper insulating layer is formed of an oxide film obtained through thermal oxidation of a poly-silicon layer with an oxidation-proofing film pattern thereon, while a gate electrode can be formed in self-alignment.

Accordingly, formation of a dummy film pattern (first step), formation of an $SiO_2$ film (second step), formation of a side wall (third step), etching of the underlayer (fourth step), and formation of a preliminary $SiO_2$ film (fifth step) are carried out in substantially the same manner as in the third process already described (see FIGS. 10A to 10E).

In the sixth step of the fifth process, the second preliminary $SiO_2$ film 84 (preliminary film of the structure obtained in the fifth step (see FIG. 10E) is etched away from the upper surface thereof to a depth flush with the upper surface of the protrusion 32 according to an anisotropic etching (dry etching) technology. The $SiO_2$ film remaining after this etching operation is to serve as the lower insulating layer 36.

In the subsequent seventh step, a poly-silicon layer 112 having an upper surface flush with the upper surface of the dummy film pattern 62 is formed on the lower insulating layer 36 and the exposed area of the upper surface of the protrusion 32. This is done, for example, using the following procedure.

A preliminary poly-silicon film 120 having a planar upper surface (indicated by the broken line in FIG. 12B) is formed on the whole upper surface of the structure obtained in the sixth step (see FIG. 12A) according to a CVD method, and then etched back from the upper surface thereof with the dummy film pattern 62 (e.g., a nitride film) being used as an etching stopper to form the poly-silicon layer 112. Therefore, the poly-silicon layer 112 is in such a state that it surrounds the periphery of the dummy film pattern 62, while part of the lower surface thereof is in contact with part of the upper surface of the protrusion 32 and the other part of the lower surface thereof is in contact with the lower insulating layer 36 (see FIG. 12B).

The subsequent steps of the fifth process are carried out in substantially the same manner as in the fourth and subsequent steps of the fourth process already described (see FIGS. 11D to 11K). In this example of the fifth process, however, a gate groove is automatically formed when the dummy film pattern 62 is removed. These steps will be described briefly.

In the eighth step, a thermal oxidation-proofing film 114, for example, in the form of a nitride film pattern, is formed on the poly-silicon layer 112 and the dummy film pattern 62 in the same manner as in the fourth step of the fourth process (see FIG. 12C).

In the subsequent ninth step, the poly-silicon layer 112 is subjected to thermal oxidation to form an oxide film 42a while at the same time defining a poly-silicon region 116. Also in this example, the oxide film 42a constitutes part of the upper insulating layer 42, while the poly-silicon region 116 is turned into the first and second principal electrode regions 38 and 40. In the subsequent tenth step, the thermal oxidation-proofing film 114 is removed (see FIG. 12D).

In the subsequent eleventh step, phosphorus or arsenic ions are implanted into the first and second principal electrode regions 38 and 40 to decrease the electric resistance of the principal electrode regions (see FIG. 12E).

In this example of the fifth process, the dummy film pattern 62 is removed from the structure obtained in the eleventh step (shown in FIG. 12E) according to a suitable method to expose the upper surface of the protrusion 32 and form a gate groove 56 defined by the side wall of the principal electrode regions 38 and 40 and the part 42a of the upper insulating layer 42. As a result, the structure having a cross-sectional profile as shown in FIG. 11G is obtained. Therefore, in this example of the fifth process as well, the first and second principal electrode regions 38 and 40 are in a state of the lower surfaces of the innermost end portions thereof in the length-wise direction of a channel being in contact with the respective end areas of the upper surface of the protrusion 32 all along those respective end areas in the width-wise direction of the channel, while the lower surfaces of the other portions of the principal electrode regions 38 and 40 are completely in contact with the lower insulating layer 36 and the peripheries of the principal electrode regions 38 and 40 other than the upper surfaces thereof and the protrusion 32 are surrounded by the isolation oxide film 42a (see FIG. 11D).

The subsequent necessary steps of the fifth process can be carried out in substantially the same manner as in the fourth process to finally obtain the fifth structure of FET as shown in FIG. 12F.

According to this example of the fifth process, part of the upper insulating layer is formed through local thermal oxidation of the poly-silicon layer with the oxidation-proofing film pattern formed thereon and a gate electrode is formed in self-alignment, while the area of junction between the underlayer and the principal electrode regions can advantageously be small and the electric resistance of the principal electrode regions can advantageously be lowered, like the other processes according to the present invention.

While the production of the N-type channel FETs has been described in the foregoing example of the processes according to the present invention, P-type channel FETs can also be produced in a similar manner. In the latter case, replacement of impurity ions as a determinant of the conductivity type with suitable ones will suffice.

While ion implantation and subsequent thermal diffusion to lower the electric resistance of the principal electrode regions are effected after the formation of the contact holes in the foregoing first, second and third processes, these treatments may be carried out after the thermal oxidation treatment of the poly-silicon layer and before the removal of the dummy film pattern. In the fourth and fifth processes, ion implantation and subsequent thermal diffusion to lower the electric resistance of the principal electrode regions may be effected after the formation of the contact holes and before the formation of the principal electrodes. In the second to fifth processes, an $SiO_2$-containing insulating material such as silicate glass, e.g., PSG or BPSG, may be used instead of the $SiO_2$ used in the formation of the lower insulating layer.

Example of Process for Producing CMOS Structure

An example of the process for producing a CMOS structure according to one of the foregoing processes of the present invention will be described briefly. In the following example, production of a CMOS structure provided with FETs of first structure according to the first process will be described by way of example.

A P-type Si semiconductor substrate 30 is used as an underlayer. An N-type well 130 is first formed in the substrate 30 by a customary method (see FIG. 13A). This is followed by production of an N-type channel FET using the P-type substrate and production of a P-type channel FET in the N-type well 130. Therefore, the two types of FETs include constituents different in conductivity type from each other but equivalent in function to each other. Thus, functionally equivalent constituents are denoted by the same numerals or characters as used in the first process.

A nitride film as a dummy film 60 is formed on the whole upper surface of the substrate 30 (see FIG. 13B), followed by formation of dummy film pattern 62 according to a photolithographic etching technology. The distance between the two dummy film patterns 62 may be arbitrarily set in accordance with designing to increase the density of a device, or element.

Protrusion 32 of the underlayer is then formed using the dummy film patterns 62 as etching masks (see FIG. 13C).

The subsequent steps up to formation of a poly-silicon layer 72 for use in formation of gate electrodes are carried out in the same manner as in the first process already described (see FIG. 13D as well as FIGS. 7C to 7K and 8C to 8K).

In order to provide a dual gate CMOS structure, phosphorus (P) or arsenic (As) ions are implanted into a predetermined area of the poly-silicon layer 72 using a suitable mask to turn the above-mentioned area of the poly-silicon layer 72 into a high-concentration N-type conductive layer 132 for use in formation of the gate electrode of the N-type channel FET, and boron (B) ions are implanted into other predetermined area of the poly-silicon layer 72 using a suitable mask to turn the above-mentioned other area of the poly-silicon layer 72 into a high-concentration P-type conductive layer 134 for use in formation of the gate electrode of the P-type channel FET. After removal of the mask, a structure, for example, as shown in FIG. 13E is obtained.

Subsequently, the conductive layer 132 and 134 are subjected to gate etching according to a customary method to form the gate electrodes 46 (see FIG. 13F). Additionally stated, the gate electrodes may alternatively be formed through respective separate etching operations after the respective ion implantation operations.

The foregoing procedure is followed by formation of an intermediate insulating film 136, formation of contact holes 52 and 54, contact implantation, formation of first and second principal electrodes 48 and 50 for the two FETs, formation of necessary interconnections, etc. to complete the CMOS structure (see FIG. 13G).

While the two FETs are substantially simultaneously formed in the foregoing example of the process for producing the CMOS structure according to the first process of the present invention, they may be formed according to any other one of the process of the present invention.

According to one of the processes of the present invention, the production of a CMOS structure can enjoy the merits of that process, and can additionally enjoy such an advantage that isolation between a P-type channel FET and an N-type channel FET can be easily secured, while the widths of isolation can be determined by the distance between two protrusions 32 and the height thereof in the vertical direction to allow the integration of an integrated circuit to be scaled up. Furthermore, since the widths of electrical isolation can be increased according to the present invention, the CMOS structure can be made strong against latch-up to facilitate control of the CMOS structure. This can contribute to an upgrade in the performance of the CMOS structure.

The present invention has been illustrated by the foregoing specific examples. Since these examples are merely preferred ones, however, the scope of the present invention is not limited to these example. Accordingly, the present invention should be construed as encompassing a wide variety of modifications and alternatives.

For example, while the introduction of the impurity into the principal electrode regions to lower the electric resistance thereof is done in the seventh step preceding the formation of the gate electrode in the examples of the fourth and fifth processes, it may alternatively be done after the formation of the contact holes for interconnection, like in the first, second and third processes, to allow for control of the amount of impurity diffusion toward the lower side of the gate electrode.

While the N-type well is formed in the P-type substrate in the example of production of the CMOS structure, other well structure, such as a P-type well formed in an N-type substrate, may alternatively be chosen in accordance with designing.

While the dual gate CMOS structure is described in connection with the conductivity types of gate electrodes in the above-mentioned example, gate electrodes of the same conductivity type may alternatively be used in both of P-type and N-type channel FETs.

What is claimed is:

1. A field effect transistor comprising an underlayer having a protrusion wherein a channel is to be formed, the protrusion having side walls, a lower insulating layer, first and second principal electrode regions, an upper insulating layer, a gate electrode, a gate insulating film, and first and second principal electrodes,
    wherein said lower insulating layer is located on said underlayer in such a way as to substantially embed therein said protrusion and substantially surround the side walls of said protrusion,
    wherein said first principal electrode region is located on one side of said protrusion in the length-wise direction of a channel in such a way as to be in contact with part of said protrusion along substantially the entire length of said protrusion in the width-wise direction of said channel, and said second principal electrode region is located on the other side of said protrusion in the length-wise direction of said channel in such a way as to be in contact with part of said protrusion along substantially the entire length of said protrusion in the width-wise direction of said channel,
    wherein said first and second principal electrode regions are covered with said upper insulating layer and substantially defined by the set of said upper and lower insulating layers,
    wherein said gate electrode is located on said protrusion with said gate insulating film therebetween,
    wherein said gate insulating film extends up to, but does not overlay, the end portions of said first and second principal electrode regions, such that the edges of the gate insulating film cover essentially the top surface of said protrusions, wherein the cross-sectional shape of the lower insulating layer is such that the thickness, in the vertical direction, of the lower insulating layer gradually and continuously decreases with an increasing distance from the place of contact with said protrusion, wherein the top surface of the protrusion embedded in the lower insulating layer and the top surfaces of the first principal electrode region and the second principal electrode region are substantially co-planar, and wherein said first and second principal electrodes are in contact with said first and second principal electrode regions, respectively, via respective contact holes through said upper insulating layer.

2. A field effect transistor as claimed in claim 1, wherein said first and second principal electrode regions are in contact with said protrusion in the vicinity of the upper end edge thereof, while the area of said contact is so small as not to allow the contact resistance to adversely affect the operational characteristics of said field effect transistor.

3. A field effect transistor as claimed in claim 2, wherein said first and second principal electrode regions are in contact with the side walls of the respective upper end edge portions of said protrusions.

4. A field effect transistor as claimed in claim 1, wherein the base material of said first and second principal electrode regions is polycrystalline silicon (poly-silicon).

5. A field effect transistor as claimed in claim 1, wherein at least part of said upper insulating layer is a film formed through the thermal oxidation of poly-silicon.

6. A field effect transistor as claimed in claim 1, wherein at least part of said upper insulating layer is a film formed through the thermal oxidation of poly-silicon layer with a thermal oxidation-proofing film pattern formed thereon.

7. A field effect transistor as claimed in claim 1, wherein said lower insulating layer is formed of a member selected from the group constituting of PSG, BPSG, and $SiO_2$.

8. A field effect transistor comprising an underlayer having a protrusion wherein a channel is to be formed, a lower insulating layer, first and second principal electrode regions, an upper insulating layer, a gate electrode, a gate insulating film, and first and second principal electrodes, the protrusion having side walls, wherein said lower insulating layer is located on said underlayer in such a way as to substantially embed therein said protrusion and substantially surround the side walls of said protrusion, wherein said first principal electrode region is located on one side of said protrusion in the length-wise direction of a channel in such a way as to be in contact with part of said protrusion along substantially the entire length of said protrusion in the width-wise direction of said channel, and said second principal electrode region is located on the other side of said protrusion in the length-wise direction of said channel in such a way as to be in contact with part of said protrusion along substantially the entire length of said protrusion in the width-wise direction of said channel, wherein said first and second principal electrode regions are comprised of impurity doped polysilicon, wherein said first and second principal electrode regions are covered by said upper insulating layer and substantially defined by the set of said upper and lower insulating layers, wherein said gate electrode is located on said protrusion with said gate insulating film therebetween, wherein said gate insulating film extends up to, but does not overlay, the end portions of said first and second principal electrode regions, such that the edges of the gate insulating film cover a portion of the top surface of said protrusion, wherein the top surface of the protrusion embedded in the lower insulating layer and the top surfaces of the first principal electrode region and the second principal electrode region are substantially co-planar, and wherein the cross-sectional shape of the lower insulating layer is such that the thickness, in the vertical direction, of the lower insulating layer gradually and continuously decreases with an increasing distance from the place of contact with the protrusion, and wherein said first and second principal electrodes are in contact with said first and second principal electrode regions via respective contact holes through said upper insulating layer.

9. A field effect transistor comprising an underlayer having a protrusion wherein a channel is to be formed, a lower insulating layer, first and second principal electrode regions, an upper insulating layer, a gate electrode, a gate insulating film, and first and second principal electrodes, the protrusion having side walls, wherein said lower insulating layer is located on said underlayer in such a way as to substantially embed therein said protrusion and substantially surround the side walls of said protrusion;

wherein said first principal electrode region is located on one side of said protrusion in the length-wise direction of a channel in such a way as to be in contact with part of said protrusion along substantially the entire length of said protrusion in the width-wise direction of said channel, and said second principal electrode region is located on the other side of said protrusion in the length-wise direction of said channel in such a way as to be in contact with part of said protrusion along substantially the entire length of said protrusion in the width-wise direction of said channel;

wherein said first and second principal electrode regions are covered by said upper insulating layer and substantially defined by the set of said upper and lower insulating layers, wherein said gate electrode is located on said protrusion with said gate insulating film therebetween, wherein said gate insulating film is comprised of $SiO_2$, wherein said gate insulating film extends up to, but does not overlay, the end portions of said first and second principal electrode regions, such that the edges of the gate insulating film cover essentially the top surface of said protrusion, wherein the top surface of the protrusion embedded in the lower insulating layer and the top surfaces of the first principal electrode region and the second principal electrode region are substantially co-planar, wherein the cross-sectional shape of the lower insulating layer is such that the thickness, in the vertical direction, of the lower insulating layer gradually and continuously decreases with an increasing distance from the place of contact with said protrusion, and wherein said first and second principal electrodes are in contact with said first and second principal electrode regions, respectively, via respective contact holes through said upper insulating layer.

10. The field effect transistor according to claim 8 wherein the lower insulating layer comprises PSG, BPSG, or $SiO_2$.

11. A field effect transistor according to claim 9 wherein said lower insulating layer is substantially comprised of $SiO_2$.

* * * * *